United States Patent
Tan

(10) Patent No.: US 9,855,687 B2
(45) Date of Patent: Jan. 2, 2018

(54) SYSTEMS FOR AND METHODS OF MANUFACTURING MICRO-STRUCTURES

(71) Applicant: Yung-Chieh Tan, Cupertino, CA (US)

(72) Inventor: Yung-Chieh Tan, Cupertino, CA (US)

(*) Notice: Subject to any disclaimer, the term of this patent is extended or adjusted under 35 U.S.C. 154(b) by 0 days.

(21) Appl. No.: 14/865,940

(22) Filed: Sep. 25, 2015

(65) Prior Publication Data

US 2016/0009008 A1  Jan. 14, 2016

Related U.S. Application Data

(63) Continuation of application No. 13/025,861, filed on Feb. 11, 2011, now abandoned.

(Continued)

(51) Int. Cl.

| | |
|---|---|
| B29C 44/38 | (2006.01) |
| B29C 33/00 | (2006.01) |
| B29C 39/24 | (2006.01) |
| B29C 39/26 | (2006.01) |
| B29C 39/42 | (2006.01) |
| B29C 41/12 | (2006.01) |
| B29C 41/36 | (2006.01) |
| B29C 41/38 | (2006.01) |
| B81C 1/00 | (2006.01) |
| B82Y 30/00 | (2011.01) |
| B26F 1/26 | (2006.01) |
| B26F 1/28 | (2006.01) |
| B26F 3/00 | (2006.01) |
| B01D 39/00 | (2006.01) |
| B29C 31/04 | (2006.01) |

(Continued)

(52) U.S. Cl.
CPC ............ *B29C 44/385* (2013.01); *B01D 39/00* (2013.01); *B26F 1/26* (2013.01); *B26F 1/28* (2013.01); *B26F 3/004* (2013.01); *B29C 31/042* (2013.01); *B29C 33/0033* (2013.01); *B29C 39/24* (2013.01); *B29C 39/26* (2013.01); *B29C 39/42* (2013.01); *B29C 41/12* (2013.01); *B29C 41/36* (2013.01); *B29C 41/38* (2013.01); *B81C 1/00373* (2013.01); *B82Y 30/00* (2013.01); *B29C 2793/0045* (2013.01); *B29L 2031/14* (2013.01); *B29L 2031/737* (2013.01); *B29L 2031/756* (2013.01); *B29L 2031/7544* (2013.01); *B81B 2201/055* (2013.01)

(58) Field of Classification Search
CPC .................................................. B29C 44/385
See application file for complete search history.

(56) References Cited

U.S. PATENT DOCUMENTS

| | | | | |
|---|---|---|---|---|
| 7,411,204 | B2 * | 8/2008 | Appleby ............... | B29C 33/302 250/505.1 |
| 2009/0253353 | A1 * | 10/2009 | Ogawa ................ | B24B 37/205 451/41 |

* cited by examiner

*Primary Examiner* — Larry Thrower
(74) *Attorney, Agent, or Firm* — Jigang Jin

(57) ABSTRACT

Methods of and devices for manufacturing a multi-layered microfluidic filter are disclosed. In one embodiment, method of manufacturing a multi-layered filter comprises providing a first molding plate that includes a plurality of apertures and is coupled to a flow stream source, applying from the flow stream source a first flow stream to pass through the plurality of apertures of the first molding plate, forming a first membrane layer comprising a first set of pores using the first molding plate and the first flow stream, controlling the first flow stream to generate a second flow stream from the first set of pores of the first membrane layer, and forming a second membrane layer comprising a second set of pores using the second flow stream and the first membrane layer.

12 Claims, 30 Drawing Sheets

Related U.S. Application Data

(60) Provisional application No. 61/303,605, filed on Feb. 11, 2010, provisional application No. 61/303,613, filed on Feb. 11, 2010, provisional application No. 61/325,701, filed on Apr. 19, 2010, provisional application No. 61/409,799, filed on Nov. 3, 2010.

(51) Int. Cl.
*B29L 31/00* (2006.01)
*B29L 31/14* (2006.01)

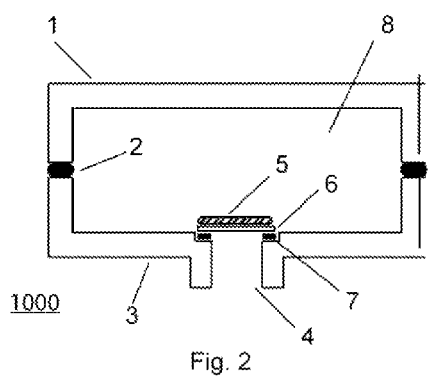
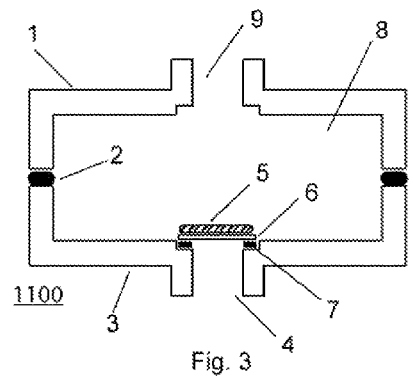
Fig. 2                               Fig. 3
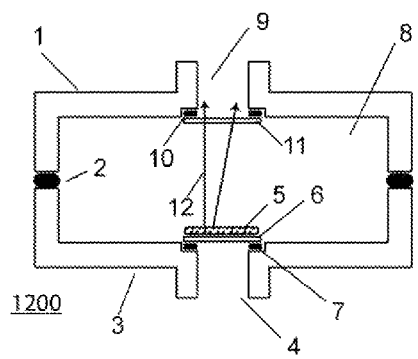
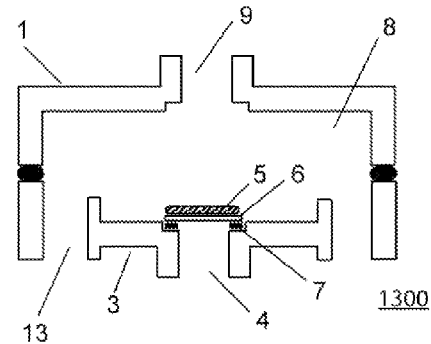
Fig. 4                               Fig. 5
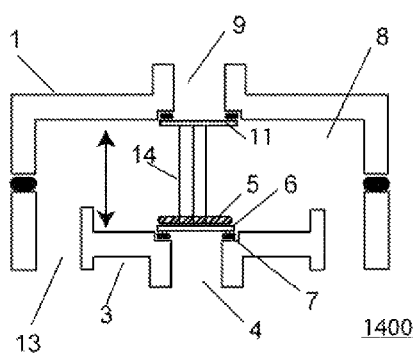
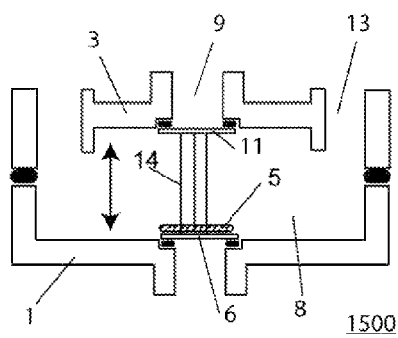
Fig. 6                               Fig. 7

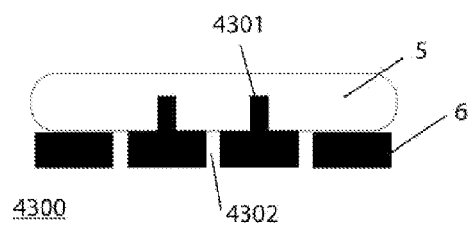
Fig. 23
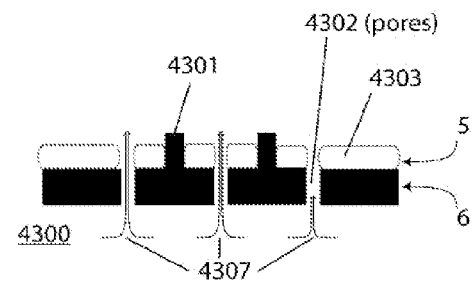
Fig. 24
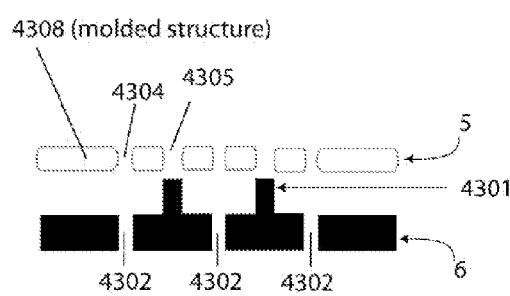
Fig. 25
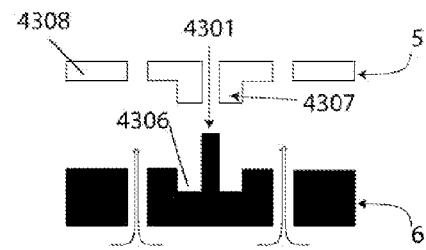
Fig. 26
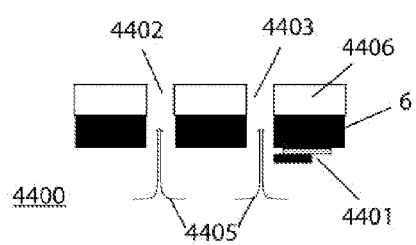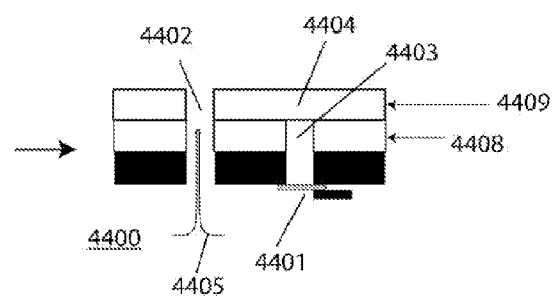
Fig. 27

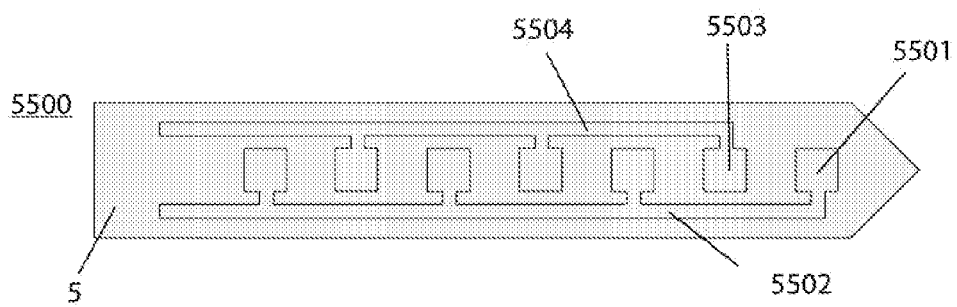
Fig. 44
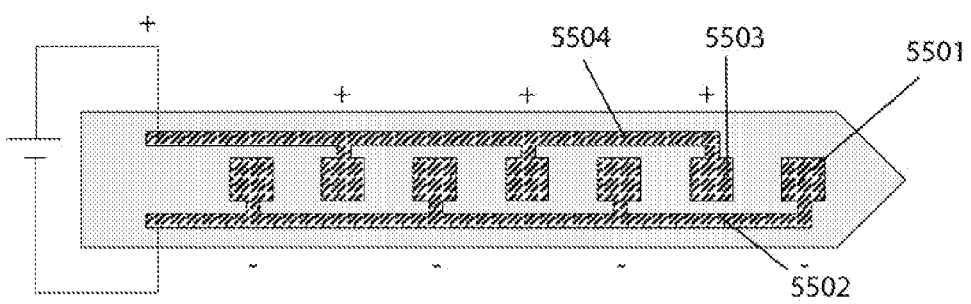
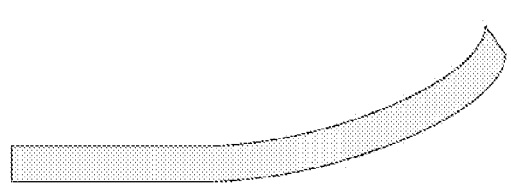
side view (extended)
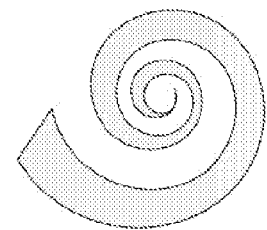
side view (coiled)
Fig. 45

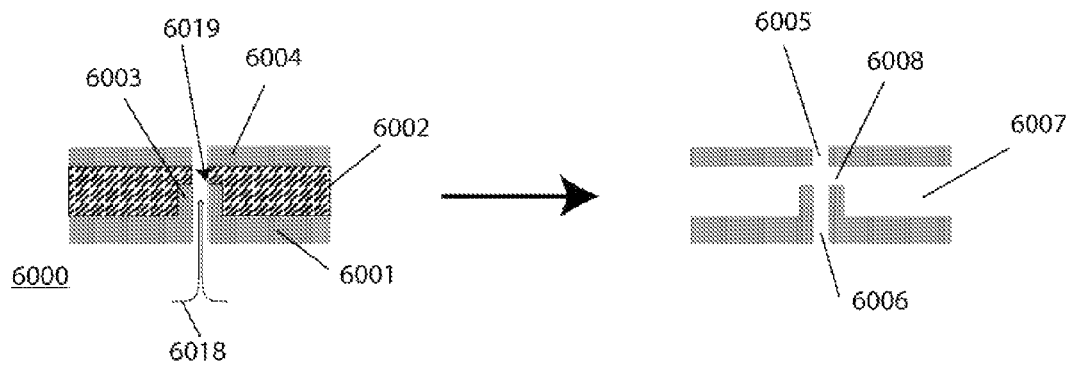
Fig 46
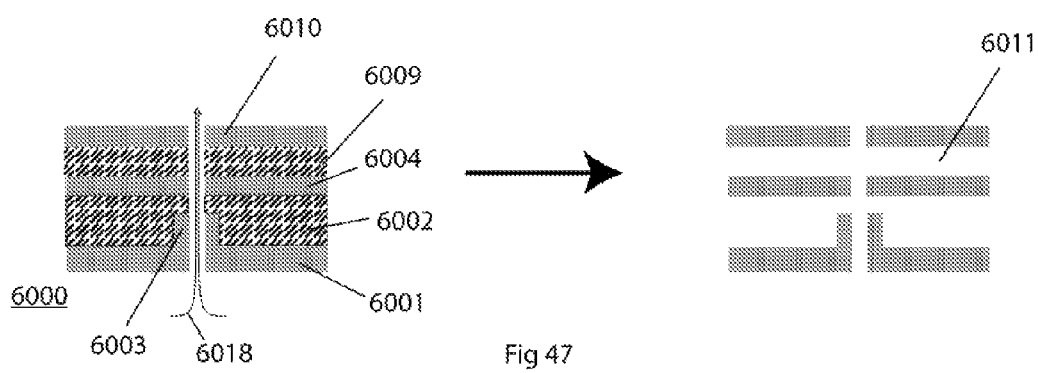
Fig 47
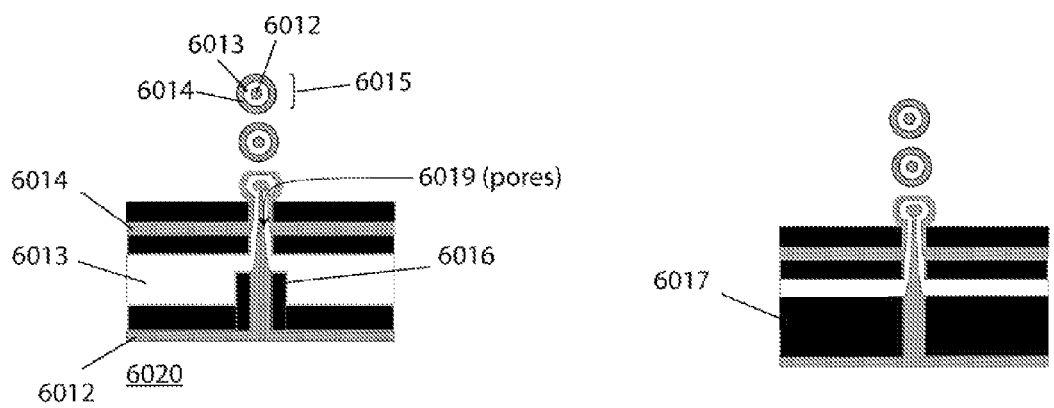
Fig 48
Fig 49

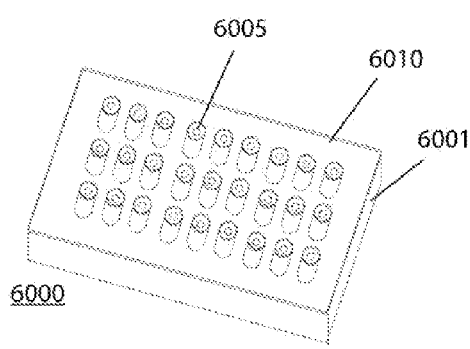
Fig. 50
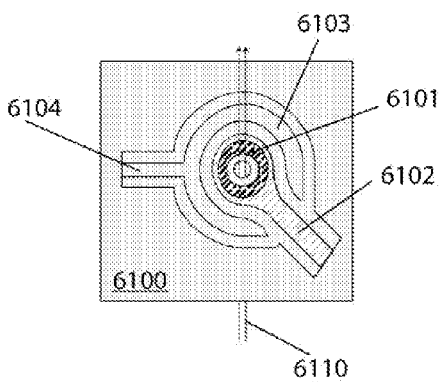
Fig. 51
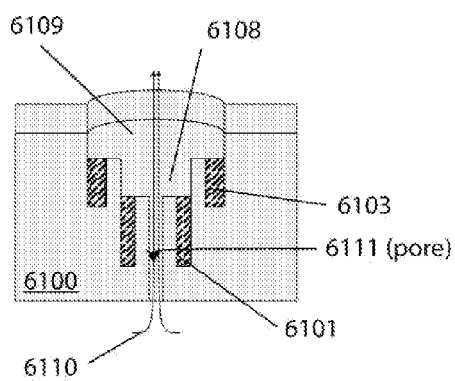
Fig. 52
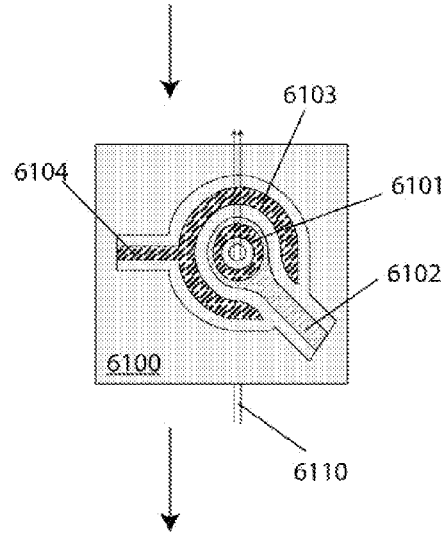
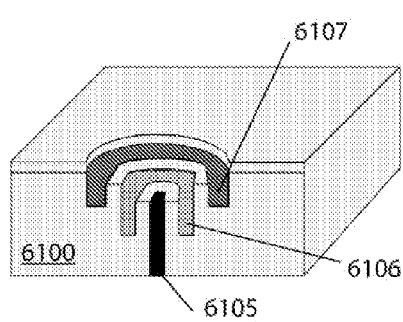
Fig. 53
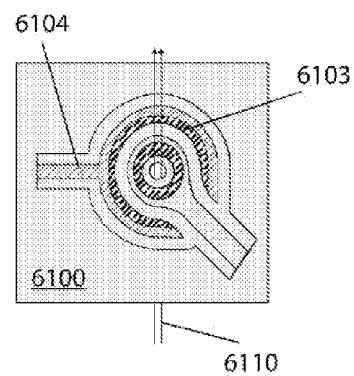

6600 no rotation (side AB stays the same)

6600 rotated 90 degrees

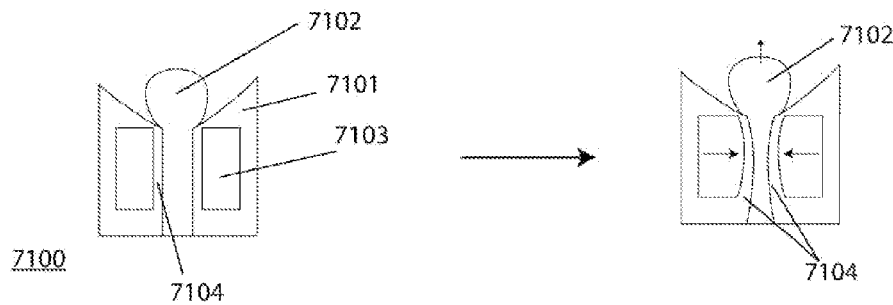
Fig. 78
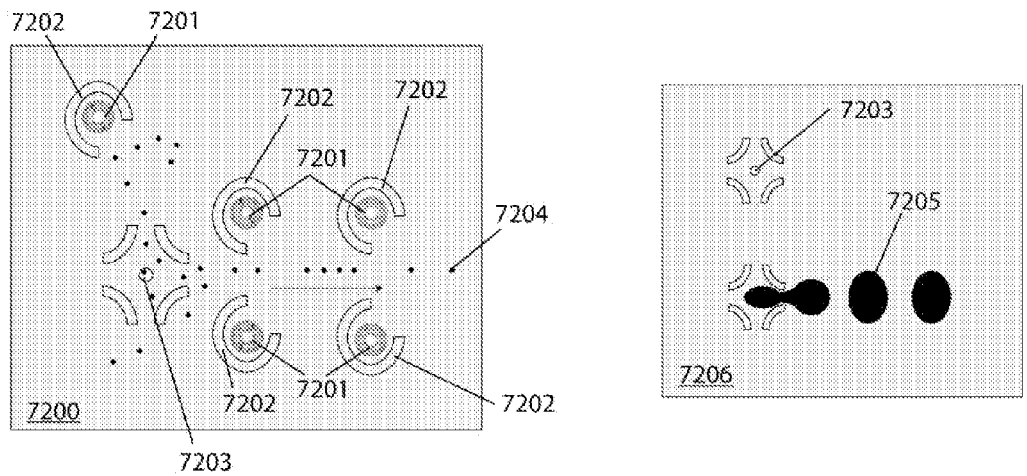
Fig. 79
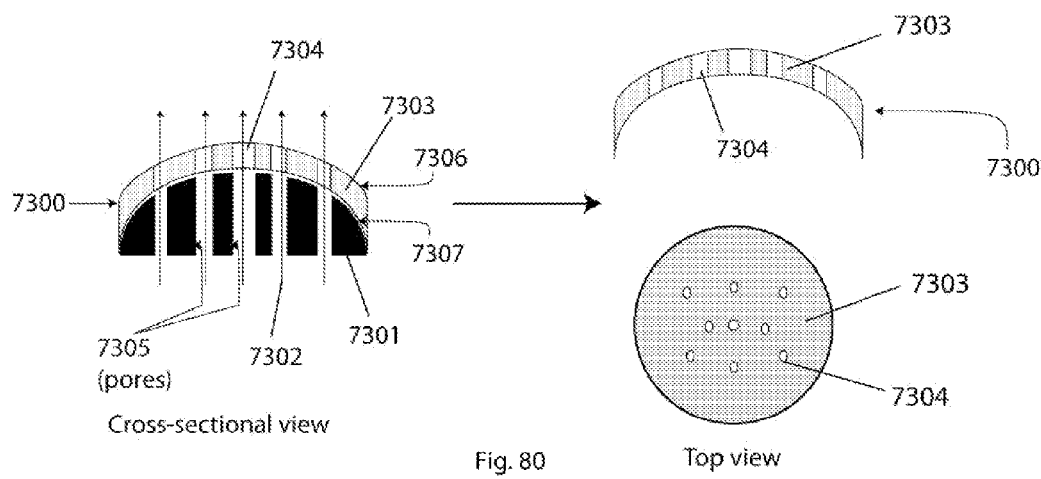
Cross-sectional view
Fig. 80    Top view

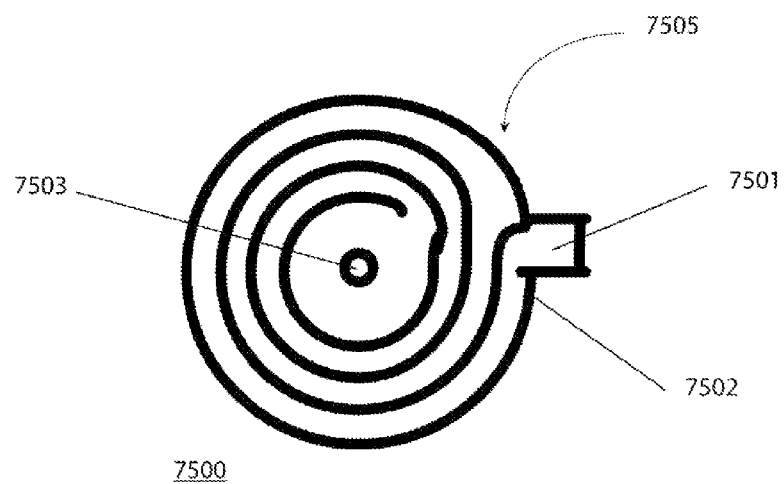
top view
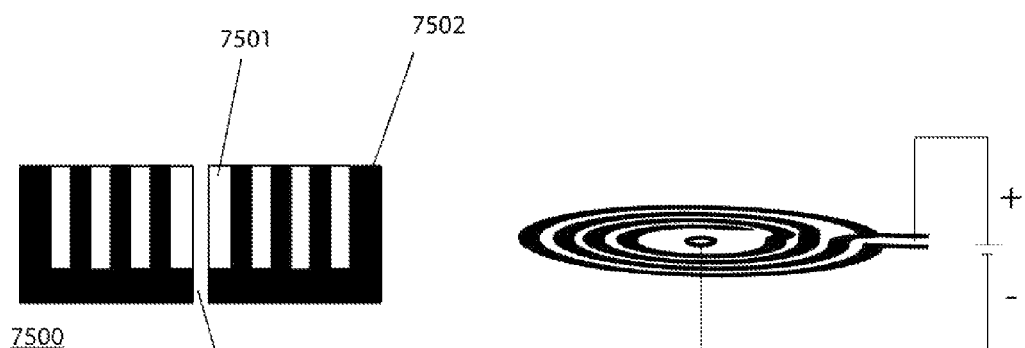
cross-sectional view    Generates an electromagnetic field
Fig. 84

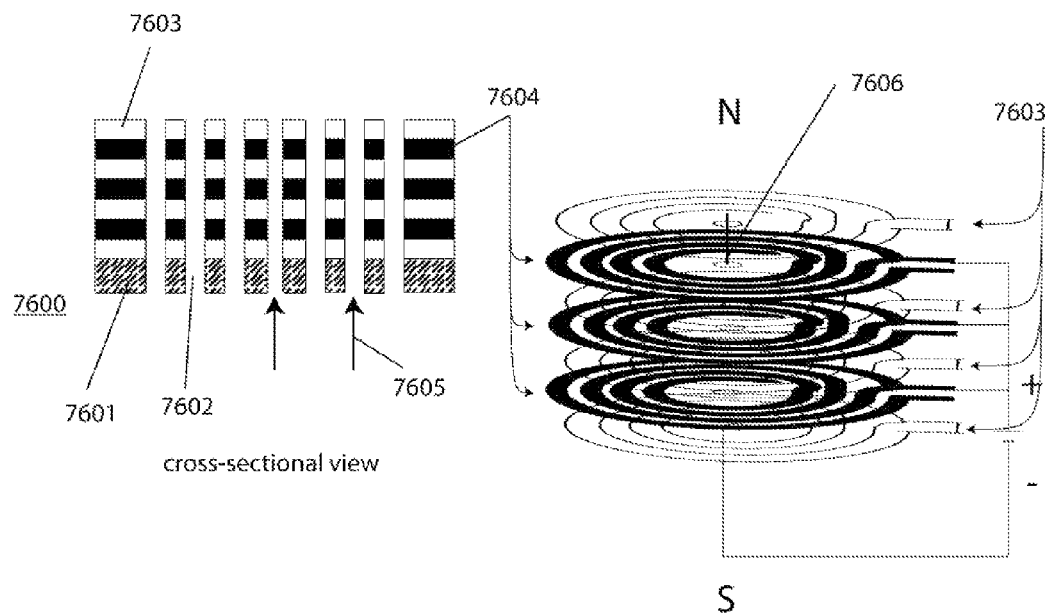
cross-sectional view
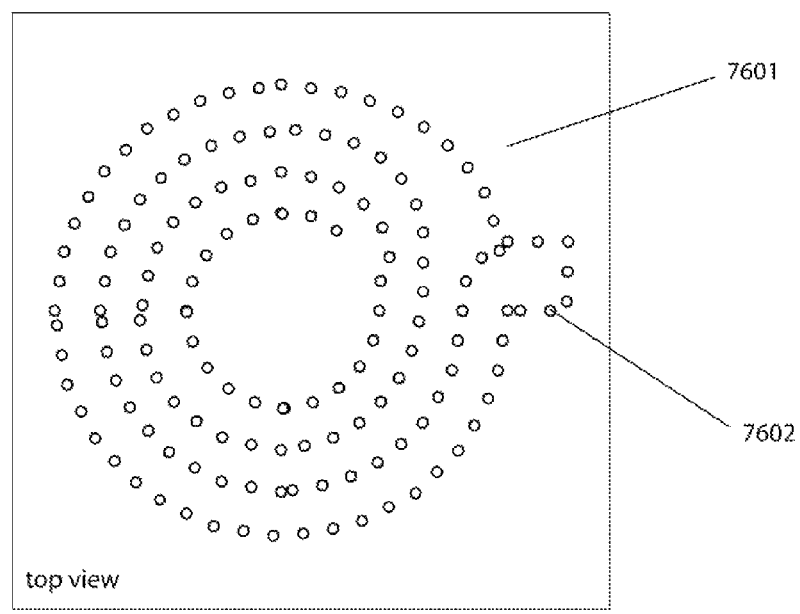
top view
Fig. 85

SYSTEMS FOR AND METHODS OF MANUFACTURING MICRO-STRUCTURES

CROSS-REFERENCE TO RELATED APPLICATIONS

This Patent Application is a continuation and claims priority of U.S. patent application Ser. No. 13/025,861, filed Feb. 11, 2011, titled "SYSTEMS FOR AND METHODS OF MANUFACTURING MICRO-STRUCTURES", which claims priority under 35 U.S.C. 119 (e) of the U.S. Provisional Patent Application Ser. No. 61/303,605, filed Feb. 11, 2010, titled "A SYSTEM AND METHOD FOR MANUFACTURING MICRONEEDLES;" U.S. Provisional Patent Application Ser. No. 61/303,613, filed Feb. 11, 2010, titled "A SYSTEM AND METHOD FOR MAKING NOZZLES, MEMBRANES, MICROSIEVES, AND MICROCANTILEVERS;" U.S. Provisional Patent Application Ser. No. 61/325,701, filed Apr. 19, 2010, titled "MINIATURIZED SYSTEMS AND METHODS FOR COOLING DEVICES;" and U.S. Provisional Patent Application Ser. No. 61/409,799, filed Nov. 3, 2010, titled "FORMATION OF SELF-ALIGNED MULTI-LAYERED MICRO AND NANO-STRUCTURES," which are hereby incorporated by reference for their entirety for all purposes.

FIELD OF INVENTION

The present invention generally relates to microstructure manufacturing devices, methods, and applications. More in particular, the invention relates to methods of and devices for controlled flow assisted microstructure manufacturing.

BACKGROUND OF THE INVENTION

Typical micromachining process is capable of producing microstructures. The high capital investments required and the low processing yield limit the commercial applicability of this process. One reference teaches using gas to force the flow of molding material into a hollow cavity, and by keeping the continuous flow of a gas, a through pore is also formed within the molded material in the cavity. The thickness of the walls of microneedle formed in the reference is largely affected by the size of the hollow cavity and the flow conditions.

SUMMARY OF THE INVENTION

Methods, system, apparatus, and component for making pores, nozzles, and slits are described. In some embodiments, the methods create pattern in the molded substrate by controlling the location and direction of a controlled flow stream through molding plates. The molding plate contains a predefined pattern that is able to be used to create the desired pattern in the molding plate.

In some embodiments, the controlled flow stream is able to go from one end of the molding plate through the through-pores to the other end of the molding plate. The through-pores in the molded substrate are able to be created from the molding plate through the use of a series of flow streams. The flow stream is able to be formed by mechanical pressure, electrical gradient, chemical gradient, magnetic gradient, or thermal gradient. The method is able to be used to make concentric annular flow nozzles, mass-arrays of flow valves, nano filters, hollow microneedles, micro stacked hollow discs, tubes, and hollow membrane. The features created in the moldable material are able to be as small as sub micrometers and as large as several centimeters.

In a first aspect, a micronozzle manufacturing method comprises molding micronozzle having the shape and the thickness of the side walls of the microneedles independent to the flow conditions. In some embodiments, the flow is used to create a temporary insert inside the molding materials without causing a blow out of the molding materials. When the flow is stopped, the insert disappears automatically, which forms holes within the molded materials. The flow is able to further act as alignment elements to allow the alignment of pores within each layer added on top of each of the solidified layer.

In a second aspect, a method of manufacturing a material comprises passing one or more flow streams through a first aperture on a first surface of a molding plate, applying a molding material to a second surface of the molding plate, and forming one or more apertures on the molding material using the one or more flow streams. In some embodiments, the one or more flow streams comprise a gas stream, a liquid stream, dispersion of particles, an electromagnetic field, or a combination thereof. In other embodiments, the one or more apertures on the molding material comprise one or more through holes. In some other embodiments, the molding material is in a fluidic form, in a powder form, in a gel form, in an emulsion form, or a combination thereof. In some embodiments, the molding material comprises a polymeric material. In other embodiments, the polymeric material comprises epoxy, silicone, urethane, polysulfone, nylone, polycarbonate, or a combination thereof. In some other embodiments, the molding material comprises a piezomaterial, an electrically conductive material, an electroactive material, a magnetic material, a thermally conductive material, a photo sensitive material, an insulation material, or a combination thereof. In some embodiments, method further comprises forming a pattern on the molding material using a pattern on the molding plate. In other embodiments, the pattern on the molding material is geometrically complimentary to the pattern on the molding plate. In some other embodiments, the method further comprises solidifying the molding material. In some embodiments, the method further comprises controlling a size, a location, a shape, or a combination thereof of the one or more apertures on the molding material using the one or more flow streams. In other embodiments, the method further comprises adjusting a size, a location, a shape, or a combination thereof of the one or more apertures on the molding material by applying an external stimulus. In some embodiments, forming the pattern on the molding material using a pattern on the molding plate is independent from forming the one or more apertures on the molding material using the one or more flow streams. In some other embodiments, the material comprises a micromembrane, a multi-layered nozzle array, a cooling device, a microelectric circuit, a filtration device, or a combination thereof.

In a third aspect, a method of manufacturing a material comprises forming a first layer of the material containing a first aperture using a first flow stream passing through the first aperture and forming a second layer of the material containing a second aperture using a second flow stream passing through the second aperture, wherein the first aperture couples with the second aperture forming a through hole on the first and the second layer. In some embodiments, the second flow stream comprises the first flow stream. In other embodiments, the second aperture has a diameter larger than a diameter of the first aperture. In some other embodiments, the method further comprises controlling a size of the first aperture by adjusting a flow rate of the first flow stream. In some embodiments, the method further comprises adjusting a size, a location, a shape, or a combination thereof of the first aperture by applying an external stimulus. In other embodiments, the method comprises forming a third aperture on the first layer of the material using a third flow stream passing through the third aperture. In some other embodiments, the second flow stream comprises the first flow stream and the third flow stream. In some embodiments, the first aperture has a diameter in a range of 10 nm to 1 mm. In other embodiments, the first aperture has a diameter smaller than 100 micrometer. In some other embodiments, the first aperture aligns with the second aperture.

In a fourth aspect, a apparatus for fabricating a material comprises a molding plate comprising one or more flow stream aperture, one or more flow stream channel coupling with the flow stream aperture, and a flow stream controller configured to provide a continuous flow stream through the flow stream channel to form an aperture on a molding material before a solidification reaction of the molding material. In some embodiments, the molding plate comprises a molding pattern capable of forming a complementary pattern on the molding material. In other embodiments, the continuous flow stream has a constant pressure flow. In some other embodiments, the continuous flow stream comprises a gas stream, a liquid stream, dispersion of particles, an electromagnetic field, or a combination thereof. In some embodiments, a size of the aperture is controllable by the continuous flow stream. In other embodiments, a size of the aperture is dependent on a flow rate of the continuous flow stream. In some other embodiments, the aperture comprises a through hole.

BRIEF DESCRIPTION OF THE DRAWINGS

FIGS. 2-7 illustrate various molding setups for manufacturing microstructures in accordance with some embodiments.

FIGS. 23-27 illustrate a process of making a molded structure in accordance with some embodiments.

FIGS. 44 and 45 illustrate a method of creating a coiled molded structure in accordance with some embodiments.

FIGS. 46 and 47 illustrate multi-layered nozzles created in accordance with some embodiments.

FIGS. 48 and 49 illustrate a method of generating encapsulated compounds in accordance with some embodiments.

FIG. 50 illustrates a 3-D view of the multi-layered nozzle formed by the additive layering process in accordance with some embodiments.

FIGS. 51-56 illustrate a method of making a nozzle within nozzle structures in accordance with some embodiments.

FIGS. 77 and 78 illustrate a controllable nozzle in accordance with some embodiments.

FIG. 79 illustrates an application of pores and nozzles created within a membrane in accordance with some embodiments.

FIG. 80 illustrates the creation of porous contact lenses in accordance with some embodiments.

FIGS. 84 and 85 illustrate a method of creating an electromagnet material in accordance with some embodiments.

DETAILED DESCRIPTION OF THE INVENTION

Figure 1:
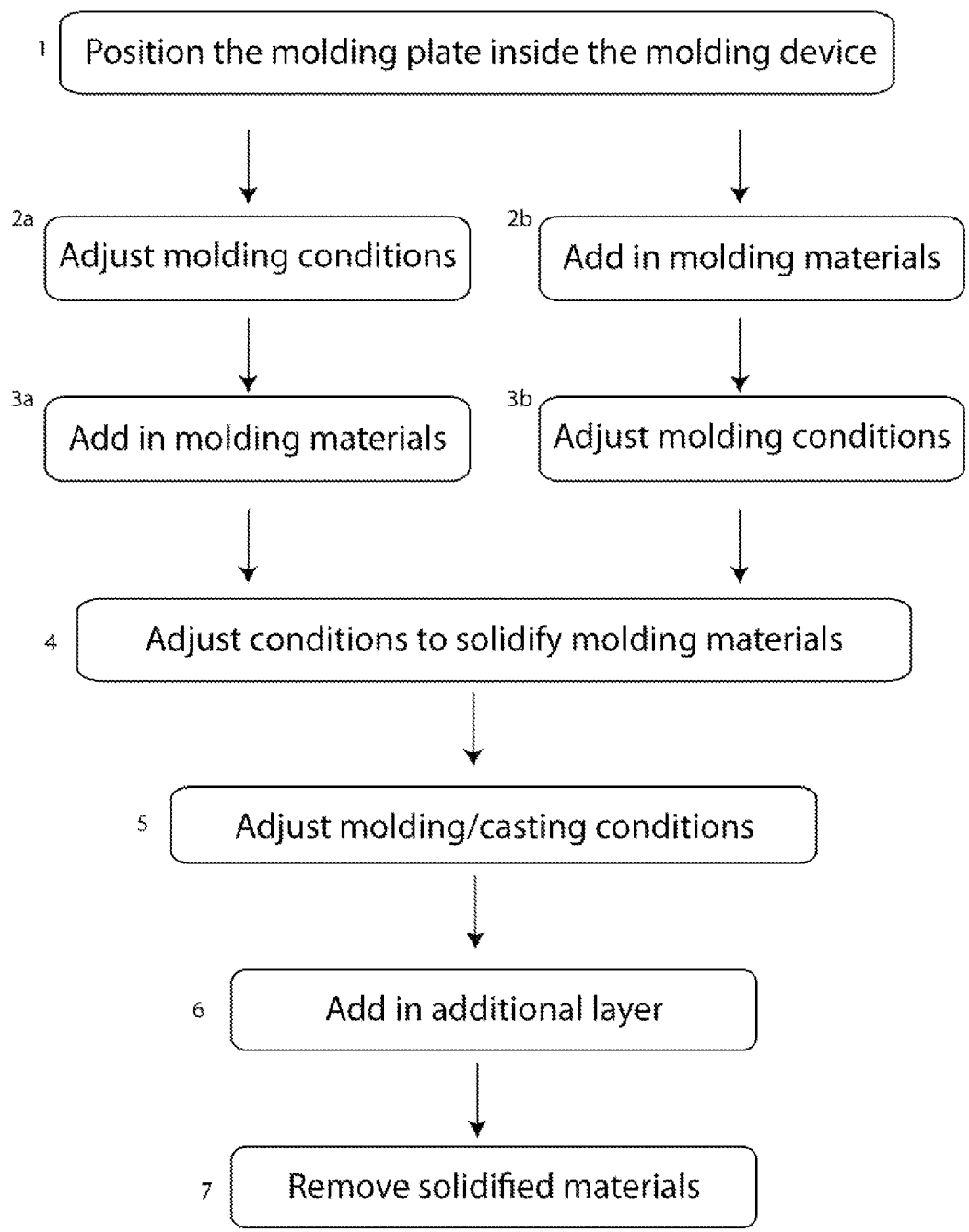
FIG. 1 illustrates the processing steps used to create microstructures in accordance with some embodiments.

In some embodiments, the nozzles, uniform micropores, and membranes generated using the methods disclosed herein are able to have a precisely controlled wall thickness, pore size, patterns and depth. In some embodiments, the thickness of the substrate is able to range from less than 1 nm to greater than 1 mm. In some other embodiments, the thickness of the substrate is able to be smaller than 1 micrometer, such as 0.5 micrometer. In other embodiments, the thickness of the substrate is able to be larger than 1 mm, such as 1 cm.

The structures are able to be formulated to have ordered composite layers to allow the control over the thickness of each layer. Unlike the conventional method, which uses etching, laser burning, or drilling to generate through-holes, the method disclosed herein is able to use flow streams to precisely align the through-holes within each substrate. The nozzles, membranes, and micropores created using the method disclosed herein are able to be generated to have an aspect ratio of greater than 1:500 rendering these traditionally fragile structures to have durable properties.

In some embodiments, a mold with holes and micro and nano features is used to control the flow of liquid or gas through a molding material. The molding material is able to be powders or liquids. The material is able to be filled before or after the flow is applied. When materials are flown through the pores, it creates virtual inserts at the surface of the molding plate. When the molding materials flow around these virtual inserts and then solidifies, pores within the molding materials are formed.

Process Flow

In some embodiments, the operation of the system comprises assembling the device with the desired mold positioned in the device, pressurizing the flow, filling in the molding material, adjusting the flow and the pressure inside the chamber, changing conditions to solidify the molding material, and removing the solidified material. A person of ordinary skill in the art will appreciate that the steps described herein throughout the specification are able to be operated in different sequences. Additional steps and material are able to be added. All the steps and materials are optional.

Materials

In some embodiments, the materials that are able to work with this molding and casting system include piezo-materials, electrically conductive materials, electro-active materials, magnetic materials, thermally conductive materials, sponge, gels, emulsions, crystals, polymers, ceramic, and metals, and polymers such as epoxy, silicone, urethane, polysulfone, nylone, polycarbonate, and polymers with micro and nanoparticle and other fillers that are able to be used as the molding materials. Photo sensitive materials, such as photoresists and other photo-activated polymers are also able to be used as molding materials in this device. A person of ordinary skill in the art will appreciate that any other material are able to be used as the molding material so long as the materials are in a controllable condition in one physical condition and capable of solidifying in another physical condition.

Molding

Design

In some embodiments, the molding and casting device comprises a sealed enclosure with inlets and outlets that control the flow of materials into and out of the chamber. The molding plate is able to be sealed above the flow forming a gas tight seal that forces the flow to go through the molding plate. The gas tight seal can be formed by using a combination of O-rings and tightening mechanisms which can involve the use of screws, glue, vacuum, pressure, electrostatic fields, magnetic fields, and covalent bonding systems. During operation, the molding material can be dispersed/dispensed onto the molding plate and the coming flow of streams through the molding plate interacts with the molding material. The interaction of the molding material with the flow and the patterns within the molding plate shape the molding material into the desired pattern, which is the pattern when the molding material solidifies. The moldable structures that are able to be derived from this technique include porous membranes, hollow nozzles, hollow needles, micro discs, micro cantilevers, nano pores, concentric nozzles, multi-layered pores, multi-layered membranes with cavities and through pores, and membranes with through pores, cavities, and cantilevers.

Shape of Mold for Forming Membranes with Uniform Pore Sizes

In some embodiments, a molding plate with many hollow through holes/pores is used to form pores in the molding material. When the molding material is cast on top of the molding plate while the streams of flow are coming out of the pores of the molding plate, the streams of flow repel and prevent the molding material from entering the through holes on the molding plate, such that the molding material flows around the streams of flows. When the molding material solidifies, the original location of the flow becomes pores within the molded material.

In some other embodiments, the molding plate is able to contain positive standout features along with through-hole features. When the molding materials are dispersed onto the molding plate, the initial level of the material is able to cover the standout features, but through flowing gas or other fluids through the molding plates, the gas pushes away the material surrounding the holes. In the process, the flow causes the molded material to spread out such that the material levels to below the standout features. When the molded material solidifies, the areas in place of the standout features become hollow features in the molded material.

Shape of Mold for Making Micro Nozzles and Other Protruding Structures

In some embodiments, the molds of the molding device are designed to have negative cavities that are not connected with the inlets where the flow is able to travel through. This design prevents the flow from interfering with the thickness of the side walls of the protruding structure. In some other embodiments for molding hollow protrusions, the molding cavities have multiple indentations. Each indentation is able to have grooves that are not connected to the through pores at the bottom of the molding plate. In operation, the molding materials do not enter the through pores and the flow that comes out of the through pores prevents any molding material from flowing into the pores.

Molding Other Structures

In some embodiments, multi-layered cantilevers and micronozzles are formed through first stacked molding of alternative layers of the molding material and the sacrificial material, and then later removing the sacrificial layers. Micro disks, tubes, needles and other hanging structures are able to be formed by the flow-through method and the stacking of different sacrificial layers and molding layers.

Design of Molding Plate

In some embodiments, the molding plate comprises a flat surface with through pores and slit openings. In other embodiments, the molding plate comprises a curved surface with pores and slit openings. In some other embodiments, the molding plate comprises positive standout features as well as negative features. In some embodiments, the molding plate comprises a curved surface with positive and negative features. In other embodiments, the molding plate comprises tapered surfaces to allow the formation of sharp tip objects. In some other embodiments, the negative features within the molding plate do not have to be connected directly to an outlet through pore. The features are able to have cavities that trap the molding materials. In some other embodiments, the molding cavities are connected to the through pores.

Alteration of Flow in Materials

In some embodiments, the flow is a liquid solution. The solution is able to be charged by electrodes. When the solution is charged and is injected through the pores, the solution is able to form a sharp cone as a result of the voltage gradient across the pores. The molding material is able to then flow around the thread created through the pores. The thread is kept in a steady state while the molding material solidifies. The locations where the liquid threads were located become pores in the molded membrane.

In other embodiments, a viscous fluid is used as the flow-in material. The liquid bridges are drawn from the pores. The molding materials are able to solidify around the liquid bridges. Upon removal of the liquid bridges, membranes with uniform pore sizes are able to be formed.

Alteration of Molding Conditions

In some embodiments, powdered materials and nanoparticles are able to be used to make the molded material by dispersing the materials onto or into the mold to allow the formation of pores. The particles are able to be dispersed either as a powder or as a mixture of powder and binding agents. The mold is able to contain traps to trap the powder materials. The flow through the pores is able to clear the materials blocking the pores, thereby creating through pores in the molded material. When a fluid is used to generate a flow through the pores, the molding process is able to be performed under another fluid such that the fluid in flow is dispersed into the fluid above the molding material. During the molding process, ultrasonic vibration is able to be used with the presented molding method to remove air bubbles.

Modification of Pore Formation Using Top and Bottom Molding Plates

The formation of pores in different materials is able to be manipulated by controlling the direction of flow as it travels through the molded material. This is able to be achieved through aligning the molding plate with another flow control structure that hangs above the molded substrate as it forms. Using this method, the pores within the molded material are able to be tilted, expanded, or shrunk according to the direction and the velocity of the flow.

Multi-Layered Formation Process

The molding materials of each layer are able to be added sequentially into the needle structure without losing the dimension and the location of the through-hole; each new layer is self-aligned according to the position of the through holes. The pores within each molded layer are self-aligned to the pores in every other layer at the respective location. The flow is able to control the distribution of molded pores within the thickness of membrane. Numerous single pores are able to be formed into larger single pores. The pores are able to shift position across the thickness of the membrane. The molded material is able to be a sacrificial material. When the sacrificial material is stacked between molded substrates, the removal of the sacrificial material creates gaps and channels between the substrates. When arrays of different layers of nozzles are molded this way, the pores in the center of the nozzles within each layer are aligned to the center of the pores at the respective location within every layer.

Change the Pattern Formation within Each Molded Layer

The molding plate is able to be designed to create a pattern difference in the different layers of molded materials and sacrificial materials. Through controlling the amount of flow and the height of the filled molding materials, a different molding pattern is able to be generated while certain critical features are kept aligned within each layer. The molding plate is able to be designed to have valves that control the flow in and the flow out of the pores. The pore formation within each of the molded layers is able to be controlled accordingly by the opening and closing of the valve. When the valve is open, the molding material is able to form holes, and when the valve is closed, no pores form in the molded material.

Shrinkage of Formed Pores

When the molding material used for molding membrane or nozzles is an expandable material, the pores formed within the solidified material are able to be shrunk through the expansion of the molded material.

Molding Nozzles with Pockets of Cavities

When stretchable materials are used as a molding plate, some negative features within the molding plate are able to be filled with sacrificial materials. The flow through the pores is able to pattern the features within the sacrificial materials. When the molding plate is formed together with the molded material and the sacrificial material as a whole, the removal of the sacrificial material creates pockets of spaces around each of the pores. When the trenches are filled with a fluid or gas, the walls around the pores are able to expand and contract according to the pressure variations.

Nanopore Formation by Aligned Shifting

When two or more membrane layers with regular spaced pores/grids are initially aligned within each layer, the membranes are able to be shifted later to create pore/grid sizes that are smaller than the pores within each layer. Each membrane is able to be separated by a sacrificial layer that can be removed to form gaps that would facilitate the shifting of each membrane. Nano sized pores are created by matching pores that are larger than the target sizes. For example, when a micron sized pore in the very top layer is aligned to a micron sized pore in the bottom layer with a sacrificial layer between the two layers, the removal of the binding of the sacrificial layer provides the freedom for the two membranes to move. The movement of the top membrane by 500 nm to the right of the bottom membrane will create a 500 nm pore through the top and bottom membrane.

Molding of Microvalves

Arrays of microvalves are able to be formed by using a mold that is already shaped as the base of the micro valves. The mold contains features that are able to be filled by the valve layer and then to be filled by a locking layer. During the molding process, the bottom of the mold is covered by a material. The material is able to be a fluid or a physical object that blocks the molded material from exiting the pores. The depth of the mold is able to be filled by a liquid such as water or by a sacrificial material. After the fluid is leveled within the molding substrate, the molding material that forms the valves is dispersed onto the leveled surface. When the valve material solidifies, the sacrificial material or the liquid below the valve is drained to clear the path of the pores in the mold. Then a flow is applied to flap open the valve while the necking region of the valve is locked with the mold. While in the flapped open state, a locking material is dispersed onto the necking region to lock the valve in place.

Formation of Nano Filters

Micro and nano filters and particle concentrators are able to be formed by stacking different layers of through-pore arrays containing walls and other standout-out features that are on the order of nanometers in height. When the walls of the stand-out features are bonded to the flat surface of another layer, nano-gaps are formed between the stacked surfaces. The through-pores act as conduits that connect the different layers of nano-gaps. The through-pores within each layer are able to be stacked to form continuous conduits. The through-pores are also able to be stacked to form discontinuous paths. Nano-gaps of different heights are able to be combined this way to separate molecules of different sizes.

Creating Array of Independent Rows and Columns

When the gas flow is high enough, the layers formed on top of the nozzle are able to form an enlarged opening. If the nozzle is embedded inside the channel, then the opening formed by the gas is able to reach the entire width of the channel; thus dividing the layer into isolated patches. Another material is able to be cast on top of the isolated patches. This material is able to be made to fill into the entire structure or to fill into just a limited number of layers. The degree of filling depends on the control of the gas flow.

Allocating Each Nozzle to a Pair of Column and Row

The channels surrounding the membrane nozzles are able to be filled with a conductive material. In some embodiments, the conductive material in the columns and rows do not intersect with each other; in the vertical direction, the column and rows are separated by an isolated electro-active element formed by the isolated patch method. When one row and one column of the matrix are activated, one electro-active element is activated, and thus it activates the associated nozzle in the matrix.

Creating Concentric Nozzles

Channels forming the shape of a spiral with a nozzle in the center are able to be used to form concentric nozzles. A sacrificial material is able to be filled into the membrane channel. A layer of membrane material is able to be cast on top of the sacrificial material. Another sacrificial material is able to be filled into the other channel. Another layer of membrane material is able to be cast on top of the sacrificial material. All the steps are able to be performed while the gas flows through the pores. The gas flow is able to be controlled to be high enough to allow the membrane material to partially cover the sacrificial material near the nozzle. Everywhere else, where the gas flow does not affect the filling of the membrane material, the membrane material is able to cover fully the sacrificial material. Removal of the sacrificial material creates embedded channels that connect to concentric nozzles.

Integrated Devices

Active Membrane Matrix

A matrix array with isolated electro-active elements sandwiched between continuous layers of electrodes is able to be created using methods described above. Electrical charges are able to be applied to the column and rows to activate the electro-active element at the specific location to active the nozzles.

Electrostatic Beads Coupled Valves and Filters

By creating a nozzle structure with layers of conductors and insulator, the electrical charges are able to be manipulated within each conductive layer. When beads with an electrostatic charge are filled inside the nozzles, the charges are able to move the beads up and down the nozzle. The size of the beads is able to determine the packing of the beads inside the nozzles. The thickness of each layer is able to be adjusted to control the distance of the electrostatic movements. By using an electrostatic bead that is large enough to cover the entire nozzle, the bead is able to be used to seal the nozzle to control the flow into and out of the nozzle.

Bubble Actuators

When the nozzles with embedded electro-active elements are immersed in a liquid medium, gas trapped inside the nozzle forms bubbles with the bubble sizes predetermined by the dimensions of the nozzle. By activating the electro-active elements, (e.g., piezo material) the bubble is able to vibrate. The vibration of the bubble causes a flow around the surface of the bubble. With proper positioning of the nozzles and the positioning of the bubbles, the vibration is able to be synchronized to cause a directional flow in the liquid medium. The flow is able to be used to manipulate the movement of molecules in the liquid.

Emulsification Device

The nozzles are able to be used to generate droplets when at least two immiscible mediums are used. The dispersed medium is able to flow through the orifice of the nozzle while the continuous medium covers the rest of the nozzle surface. The shape of the channels and nozzles are able to cause a difference in the pressure distribution in the dispersed phase, resulting in the formation of emulsions (droplets)

Curved Membrane and Nozzles

Curved membrane and nozzles with through holes are able to be formed from a casting plate with an angled surface containing through-holes and in some cases through-holes and grooves. The curved membrane is able to form lenses with through-holes.

Color Image Display Device

A membrane structure contains several specialized nozzles. Within each nozzle, there are able to be at least three smaller nozzles. Each of the three smaller nozzles is able to be connected to a channel which is filled with a conductive material. The method for formulating such a structure has been described through the use of creating isolated row and column elements. Colored beads with an electrostatic charge are filled into each of the nozzles. Each smaller nozzle contains colored beads of a known color. Within each large nozzle, it contains at least a red, a green, and a blue bead. The beads are localized onto the orifice of the smaller nozzles by an electrostatic charge. A conductive layer is located near the top surface of the large nozzle, and when this layer is activated, it attracts the charged beads.

When the top surface layer near the top of the large nozzle is charged, the electrostatic charges on the selected small nozzles are able to be released. The release of the charges causes selected beads to migrate toward the surface of the large nozzle. The collective presence of the beads at the surface of the large nozzle forms a colored image.

Electromagnets

Single Layered Electromagnet

A membrane with spiral channels surrounding the nozzles is able to be used to create electromagnets. The channels are able to be filled with a conductive material. A current is able to be applied to the conductive layer. Another electrode connection is able to be made through the center of the nozzle.

Multi-Layered Electromagnet

A casting plate with through-holes is able to be arranged into a spiral shape. A membrane material is able to be cast over the plate while the gas flow is applied to the through-holes. The gas flows exiting the through-hole define the shape of the membrane material. A conductive layer is then able to be cast over the membrane material. When the conductive layer solidifies, an insulating material is able to be cast over the conductive layer. Multiple conductive and insulation layers are able to be patterned by the gas streams to form a multi-layered coil. Applying a current through the coil causes the formation of a magnetic field.

A cooling system that utilizes microflow is able to be created using the porous membranes in accordance with some embodiments. The porous membrane contains top channels, through pores and bottom cavities. The top channels and the through pores are molded by the molding plate, and the bottom cavities are created by using flow merging of two pores that are within proximity of each other. When a flow of fluids or gas is introduced into the cooling system with the heating source attached to the bottom of the device, the microflow traveling from the top channel through the pores to the bottom cavity and then up through the pores is able to absorb heat and then remove the heat from the source.

The molding of microneedle is able to be achieved by using a molding plate with a tapering cavity and a through pore. The tapering cavity forms a tapered tip that is able to penetrate the skin. The through pore is able to create through pores inside the microneedle to allow the continuous flow of molecules through the microneedles into the skin.

A continuous molding system is disclosed in accordance with some embodiments. The continuous molding system comprises a molding plate attached to rollers and a flow source. The flow source is able to allow pores to be formed within a molded material. A height adjustor is able to be used with the system to control the thickness of the molded structure. A separator is able to be used with the system to separate the solidified material from the molding plate. The molding plate is able to be made out of a flexible material.

More details of the methods of and devices for manufacturing microstructures are described in the following.

FIG. 1 illustrates the processing steps used to create microstructures in accordance with some embodiments. In Step 1, a molding plate or a molding structure that contains a predefined pattern is placed in the molding device.

In Step 2a, the molding conditions are adjusted to allow the generation of temporary moldable patterns inside the molding chambers. The molding condition is able to be adjusted based on the (shapes) of the molding devices.

In Step 3a, the molding material is introduced into the molding device after the generation of the temporary moldable patterns. The molding material is able to fill the predefined temporary moldable patterns due to the predefined conditions generated within the molding device. In some embodiments, the molding material is poured into the molding device first before the predefined patterns are created. For example in Step 2b, the molding material is added. In Step 3b, the molding condition is adjusted.

In Step 4, the molding conditions are changed to allow the materials to solidify after the molding material forms into the predefined pattern. Different molding conditions are able to be initiated to solidify different materials. In some embodiments, temperature sensitive materials are able to solidify by changing the temperature. In some other embodiments, chemical sensitive material is able to solidify by introducing chemical imitators into the system. In some other embodiments, light sensitive material is able to solidify in response to the introduction of a specific wavelength within the electromagnetic spectrum. A person of ordinary skill in the art will appreciate that various conditions, reagents, materials are able to be used to solidify the molding materials.

In Step 5 and Step 6, additional layers are able to be added by repeating the steps described above. In Step 5, the molding/casting conditions are adjusted. In Step 6, an additional layer is added. A person of ordinary skill in the art will appreciate that any numbers of layers are able to be added by repeating the Steps 5 and 6. When creating one or more secondary layers, the solidified initial material is able to act as a new molding structure. Newly added materials are then able to solidify onto the molded layer to form the second layer of materials. The process is able to be repeated to form as many layers as needed with the feature patterns transferred and aligned between each layer according to the pattern formation created by the molding conditions. In Step 7, the solidified materials are able to be removed.

FIGS. 2-7 illustrate various molding setup for manufacturing microstructures in accordance with some embodiments. The microstructure manufacturing is able to be performed using the system 1000-1500.

FIG. 2 illustrates components for the system 1000 in accordance with some embodiments of the present invention. The system 1000 is able to contain a top plate 1, bottom plate 3, an inner chamber 8, and a bottom opening 4. The top and bottom plates are sealed by one or more gaskets 2. The molding plate 6 is sealed to the bottom plate by gasket 7. In some embodiments, the molding plate 6 contains molding patterns. In operation, an inward flow is able to be introduced from opening 4 through the molding plate and through the molding materials 5. When a gas is introduced through opening 4, the pressure generated by the gas will be maintained inside the chamber 8. The pressure will then force the molding materials 5 against the molding plate and thereby force any bubbles out of the molding materials into the chamber. The gas is able to be maintained as a continuous flow or as a non flowing gas at a constant pressure that is stabilized inside the chamber 8.

FIG. 3 illustrates the system 1100 in accordance with some embodiments of the present invention. The components of system 1100 share the same numbering system as the components of the system 1000 in FIG. 2. In addition to the components 1-8, the system 1100 has an opening 9. In operation, different gas conditions are able to be introduced through the openings 4 and 9. The pressure introduced through opening 9 is able to be used to stabilize the pressure within the chamber 8 making the system more adjustable to stabilize the molding conditions. Alternatively, a continuous flow is able to be introduced through opening 4, through the molding plate 6, then through the molding materials 5, and then through the opening 9. The direction of flow through the openings 4 and 9 are interchangeable. In some embodiments, a vacuum is able to be used to change the pressure inside chamber 8.

FIG. 4 illustrates a system 1200 in accordance with some embodiments of the present invention. In addition to the components 1-9 that are contained in the system 1100 of FIG. 3, the system 1200 contains a top molding plate 11 and top gasket seal 10. In some embodiments, the top molding plate 11 contains through holes which are able to be used to guide the direction of flow 12 through the molding materials 5, and thereby affecting the shape, length and path of the pores formed in the molding material 5.

FIG. 5 illustrates another system 1300 in accordance with some embodiments of the present invention. In addition to the components 1-12 that are contained in the system 1200 of FIG. 4, the system 1300 contains one or more openings 13. Opening 13 is able to guide the direction of the flow. In some embodiments, the flow is able to be introduced from the opening 9 to the opening 13, from the opening 4 to the opening 13, from the opening 13 to the opening 9, or any other combinations involving the three openings, 4, 9, and 13. The opening 13 is able to be used to stabilize the pressure inside the chamber.

FIG. 6 illustrates another system 1400 in accordance with some embodiments of the present invention. In addition to the components 1-13 that are contained in the system 1300 of FIG. 5, the system 1400 contains molding threads 14, which are able to be used to create pores inside the molded materials. In the system 1400, the bottom plate 3 is able to be a movable component which is able to be positioned to adjust the length and the dimensions of the thread 14. In some embodiments, the thread 14 is able to be formed from the molding plate 6.

FIG. 7 illustrates another system 1500 in accordance with some embodiments of the present invention. The system 1500 is able to be the reverse setup of the system 1400.

The molding plates 6 and 11, shown from FIG. 2 to FIG. 7 are able to be electronic devices that are capable of bearing electric charges. The electric charges are able to be used to create electro-responsive thread. In some embodiments, the molding plates 6 and 11 are able to contain valves that modulate the flow of materials through the molding plates 6 and 11. The material that forms the system is able to be of any solid material including metal, ceramic, and polymer materials. The figures above are presented along the direction of gravity. A person of ordinary skill in the art will appreciate that any other directions are applicable.

FIGS. 8-13 illustrate systems for controlling various types of flow-in materials in accordance with some embodiments of the present invention.

Figure 8:
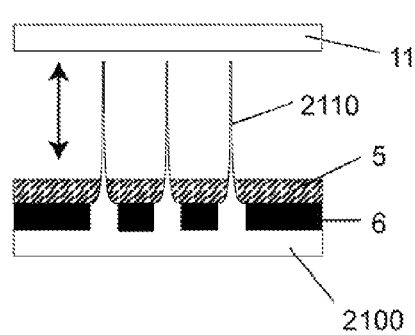
FIGS. 8-13 illustrate systems for controlling various types of flow-in materials in accordance with some embodiments.

FIG. 8 illustrates a setup for flow-in materials in accordance with some embodiments. The flow-in material 2100 is able to be formed into threads 2110. The flow-in material 2100 is able to be a viscous fluid, a polymer blend, water, liquid, metal slurries, crystal materials, particle composites, wax, membrane, organic materials, inorganic materials and a combination thereof. A person of ordinary skill in the art will appreciate that any substance in fluid state, such as solution, liquid, supercritical fluid, and/or gas, is applicable.

In some embodiments, the flow-in material 2100 is focused/forced into the threads 2110 by injecting through a molding plate 6. A molding plate 11 is able to be positioned above to facilitate the formation of the threads. Molding material 5 flows around the threads and later solidifies around the threads. In some embodiments, the threads 2110 are formed by the movement of molding plate 11, such that initially the flow-in material 2100 runs through the molding plate 6 onto molding plate 11, and then through the movement of molding plate 11 or 6 (such as moving away from each other), the threads 2110 (e.g. forming by the flow-in material 2100) is able to elongate to the desired length and dimensions.

Figure 9:
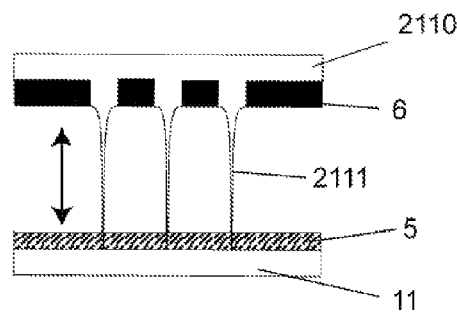

FIG. 9 illustrates another setup for flow-in materials in accordance with some embodiments. The material 2110 emerges through the top molding plate 6. The material 2110 is able to be injected through a molding plate 6 or alternatively drawn by the movements of the molding plate 6 or 11 to form threads 2111.

Figure 10:
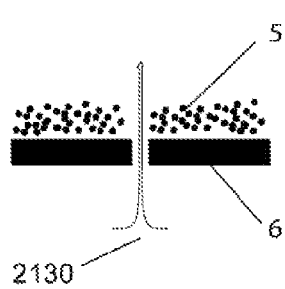

FIG. 10 illustrates a setup for flow-in materials in accordance with some embodiments. As shown in FIG. 10, a flow-in material comprises a gas 2130. The gas 2130 flows through molding plate 6 to form a series of posts within the molding material 5. The molding material 5 is able to be a powder, liquid, polymer, crystal, gel, metal, ceramic, or any composite materials.

Figure 11:
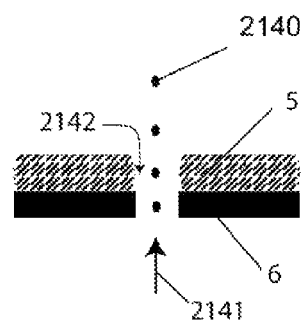

FIG. 11 illustrates another setup for flow-in materials in accordance with some embodiments. A flow-in material 2141 is in the form of particles 2140. The particles are able to be aligned to follow a series of straight paths out of the pores 2142 within molding plate 6. The particles are able to be guided by a different means including electromagnetism, electrostatics force, thermo gradient, magnetic gradient, vibrations, gravitational gradients, inertial forces, and adhesions with the blend-in gas or fluid. A person of ordinary skill in the art will appreciate that any physical, chemical, biological force and/or interactions are able to be used for guiding the particles. The particles are able to have a mass or without a mass. For example, photons are able to travel out of the pores such that the electromagnetic radiation generated from the photons keeps the molding materials from filling into the pores.

Figure 12:
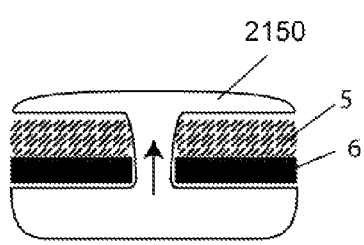

FIG. 12 illustrates another setup for flow-in materials in accordance with some embodiments. A flow-in material 2150 is able to be a liquid. The flow-in material 2150 is able to be denser or lighter than the molding material 5. When the flow-in material 2150 is lighter than the molding material 5, the flow out of molding plate 6 is able to spread on top of molding material 5. When the flow-in material 2150 is denser than the molding material 5, the flow-in material 2150 is able to spread in between molding plate 6 and the molding material 5.

Figure 13:
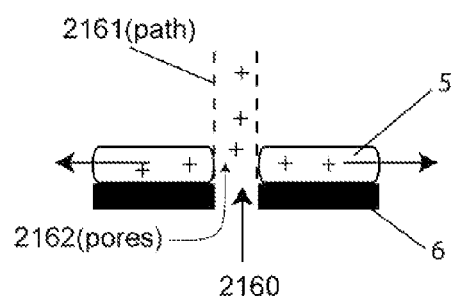

FIG. 13 illustrates another setup for molding using a flow-in material in accordance with some embodiments. A flow-in material 2160 is able to contain an electric charge. This charged flow-in material 2160 is able to be a mixture of particles in liquid, a mixture of particles in gas, a charged liquid, a dielectric material, a composite material, or any other material that can bear a charge, such as a nano-particle capacitor. When the molding material 5 used comprises a charged material, the two like charges, one on the flow-in material 2160 and one on the molding material 5, will repel each other. The strength of the flow of the flow-in material 2160 through the molding plate 6 is adjusted to be strong enough to maintain its designated path and force the molding material 5 to spread around the charged flow of 2160. When the molding material 5 solidifies, pores 2162 are formed around the paths 2161 of the charged flow. Through controlling the magnitude of the charge, the sizes of the pores can be controlled. For example, when 1 mV is applied, an array of 1 micron sized pores is able to be generated.

FIGS. 14-18 illustrate methods of making molded structures in accordance with some embodiments.

Figure 14:
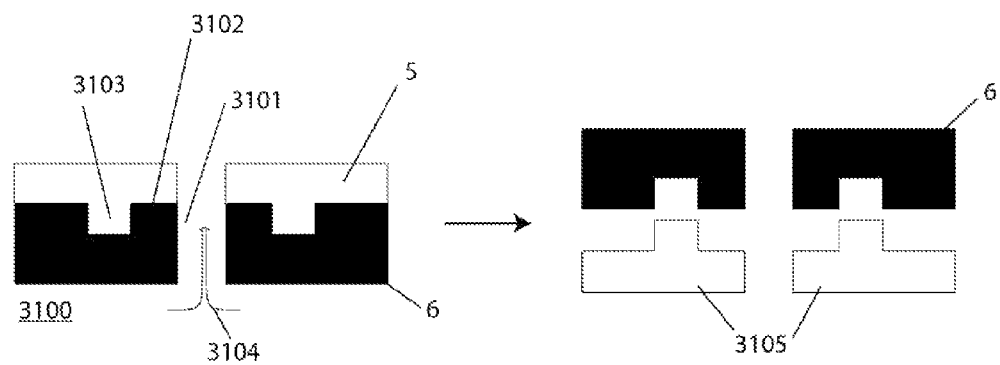
FIGS. 14-18 illustrate methods of making molded structures in accordance with some embodiments.

FIG. 14 illustrates the design and the operation of a molding plate 3100 in accordance with some embodiments. In some embodiments, the flow-in materials 3104 go through an opening 3101. The molding material 5 is able to flow around the opening 3101. The molding material does not fill into 3101, because the molding material is pushed away by the flow-in materials 3104. The molding material 5 is able to spread and adhere to the surface of the molding plate 6. The molding material 5 is able to cover a surface 3102 of the molding plate 6 and fill into the grooves of 3103 of the molding plate 6. When the molding material 5 solidifies, the molded material 5 is able to be separated from the molding plate 6 to form a molded product 3105 having a complementary pattern of molding plate 6.

Figure 15:
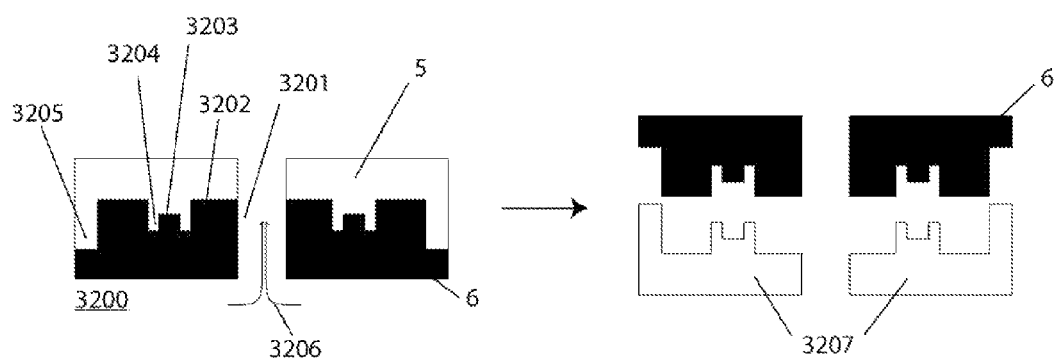

FIG. 15 illustrates a molding plate 3200 in accordance with some embodiments. The flow-in material 3206 is able to come out of pore 3201. In some embodiments, the molding material 5 is able to flow onto a surface 3202 of the molding plate 6, fills into cavities 3204 and 3205, and covers a surface 3203. The molded features are able to contain a variety of grooves, walls, and pores. A person of ordinary skill in the art will appreciate that any patterns, apertures, protrusions, figures, images, or a combination thereof are applicable. When the molding material 5 solidifies, the molded material 5 is able to be separated from the molding plate 6 to form a molded product 3207.

Figure 16:
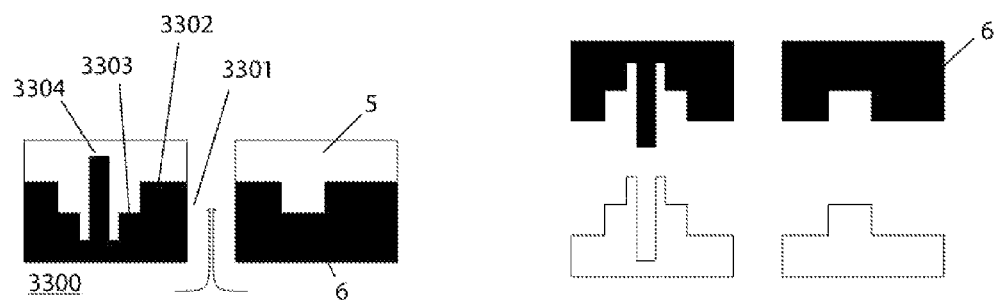

FIG. 16 illustrates another molding plate 3300 in accordance with some embodiments. The molding plate contains long posts 3304, cavity 3303, orifice 3301, and surfaces 3302 around the orifices 3301. Using the procedure described above, a product 3305 that comprises a shape complimentary to the shape of the molding plate 6 is able to be made.

Figure 17:
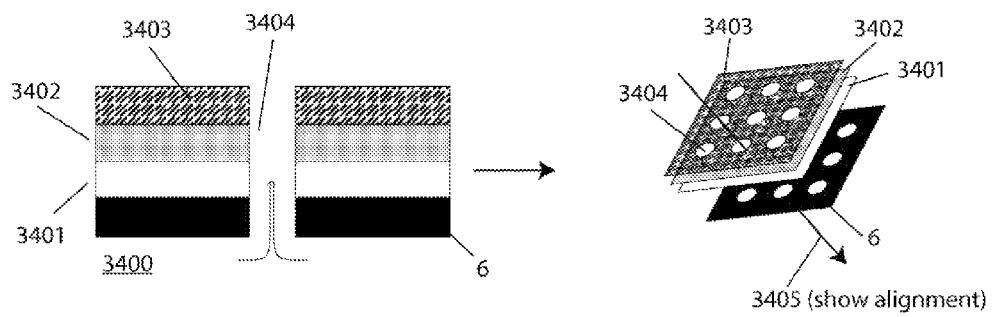

FIG. 17 illustrates a molding system 3400 in accordance with some embodiments. FIG. 17 shows that multiple layers are able to be formed by an additive process, where a first molded layer 3401 solidifies to become the mold for a second layer 3402, and the second layer 3402 solidifies to become the mold for a third layer 3403. The first layer 3401, the second layer 3402, and the third layer 3403 are able to be made out of the same material or of different materials. This method allows a pore 3404 to be self-aligned forming aligned molding 3405 within each layer during the molding process.

Figure 18:
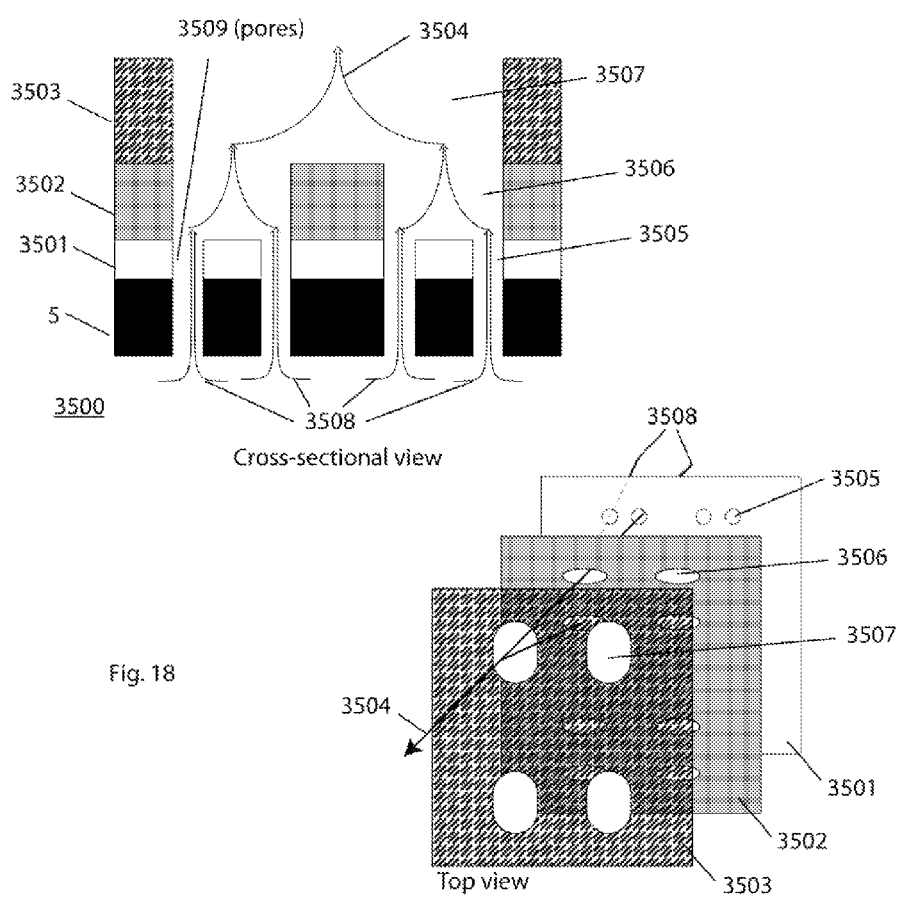

FIG. 18 illustrates an additive process in accordance with some embodiments. A system 3500 shows that by varying the amount of flow-in material 3508 through the pores 3509 and by controlling the relative distance between the pores, the size and distribution of pores is able to be varied within each of the added layers. Micro stream formed pores 3505 within layer 3501 can then merge into larger streams 3504 to construct enlarged pores 3506 and 3507 within layers 3502 and 3503, respectively. The pores 3505, 3506, and 3507 are connected in an orderly fashion due to the presence of flow in materials.

FIGS. 19-22 illustrate some nozzle types in accordance with some embodiments.

Figure 19:
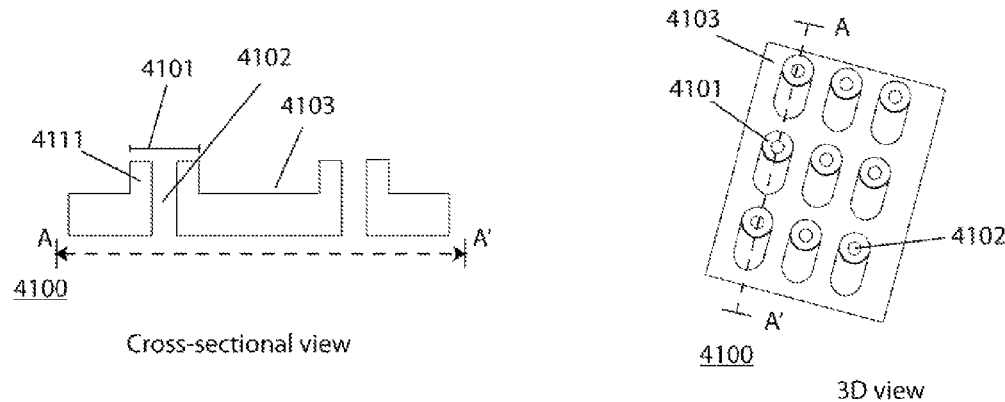
FIGS. 19-22 illustrate some nozzle types in accordance with some embodiments.

FIG. 19 illustrates a nozzle type 4100 in accordance with some embodiments. The nozzle type 4100 is able to be built by using flow-in molding method as described above. The cross-sectional view is taken along the line A-A' of the 3D view. The shape of the nozzles 4101 is able to be controlled by the pattern on the molding plate. The width of the walls 4111 of the nozzles 4101 are not affected by the amount of flow through the molding plate. The nozzles 4101 are able to be molded directly out of the cavity of the molding plate that is not connected to the through openings within the molding plate. The distance 4103 is the distance between nozzles. The pores 4102 are formed within the nozzles.

Figure 20:
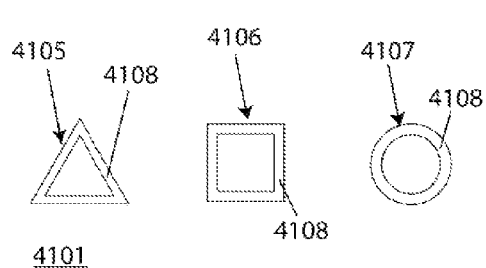

FIG. 20 illustrates different shape variation of the nozzles 4101 in accordance with some embodiments. The nozzles 4101 in FIG. 20 are able to be the same nozzles of 4101 in FIG. 19. The nozzles 4101 are able to comprise triangular opening 4105, square opening 4106, or circular opening 4107. A person of ordinary skill in the art will appreciate that the nozzles are able to have any shape of openings so long as it can function as nozzles for ejecting or injecting substances. Further, the thickness of the walls 4108 of the openings is variable.

Figure 21:
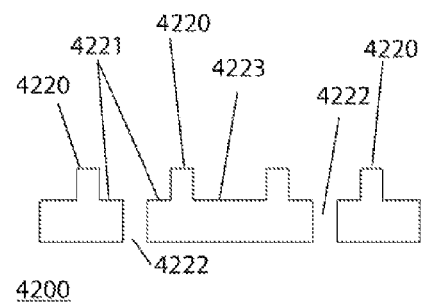

FIG. 21 illustrates another nozzle structure 4200 in accordance with some embodiments. The nozzle structure 4200 is able to be molded by the flow-in method described above. In addition to the nozzle side walls 4220, the structure also has gaps 4221 between the pores 4222 and the nozzle side walls. The distance 4223 is a distance between the nozzles 4220.

Figure 22:
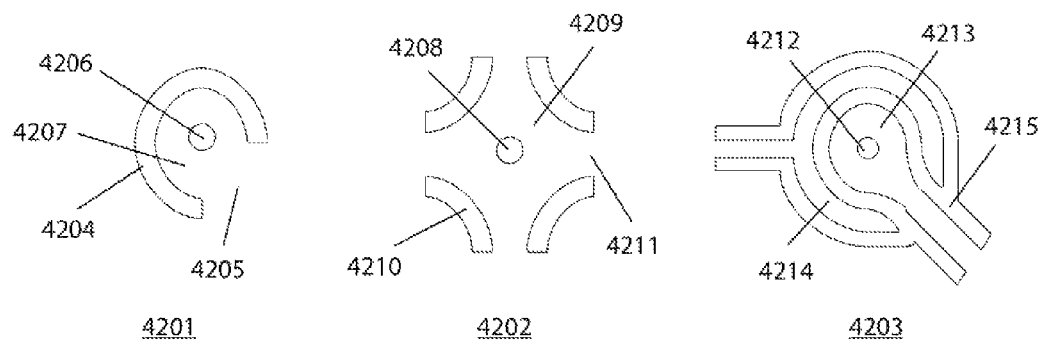

FIG. 22 illustrates a top view of three different configurations 4201, 4202, and 4203 of the nozzle structure 4200 of FIG. 21. The configuration 4201 shows a structure with a circular side wall 4204, one opening 4205 with the side wall, a through pore opening 4206 within the circular structure, and gaps 4207 between the circular side wall 4204 and the opening 4206. The configuration 4202 has a through pore opening 4208, a gap 4209, several quarter circular side walls 4210, and one or more openings 4211. The configuration 4203 has a through pore 4212, gaps 4213 and 4214, and a side wall 4215. The depth of the gap 4214 is able to be different from the depth of the gap 4213. The configurations 4201, 4202, and 4203 are able to occur as an array of devices.

FIGS. 23-25 illustrate a process of making a molded structure in accordance with some embodiments. In FIG. 23, the system 4300 comprises a molding plate 6 with post 4301 and through pores 4302. The molding material 5 is able to be cast directly above the molding plate 6. In some embodiments, the molding material 5 is able to cover the posts 4301. Referring to FIG. 24, one or more flows 4307 are able to flow through the through pores 4302, which is able to facilitate the spread of the molding material 5 to spread laterally and thereby thin out the thickness of the molding material 5 to form the structure 4303. The molding material 5 is able to recede to below the height of the post 4301 due to the presence of the flow 4307. Now referring to FIG. 25, the molded structure 4308, which is resulting from the solidification of the molding material 5, is able to be removed from the molding plate 6. The molded structure 4308 comprises pores 4304 that are formed by the action of the flow 4307 (FIG. 24) through the through pores 4302. Pores 4305 are formed by the posts 4301 on the molding plate 6.

FIG. 26 illustrates a process of making a molded structure in accordance with some embodiments. The process includes using a molding plate 6 that contains cavities 4306. Using a similar manufacturing method described above, a protruding structure 4307 on the molded structure 4308 is able to be made by using the cavity 4306 on the molding plate 6.

FIG. 27 illustrates a molding system 4400 in accordance with some embodiments. The molding system 4400 uses a molding plate 6 with a valve 4401 that is able to be configured to shut off the flow through pore 4403. In operation, the opening of the valve 4401 (turning on the flow 4405 to allow it to flow through the pore 4403) is able to make holes 4402 and 4403 in the molded structure 4406. When the valve 4401 is shut-off (flow 4405 is prevented from flowing through the pore 4403), the molded structure 4408 does not form a hole at the location 4404 in the molded structure 4408. The pores 4402 that are not covered by a valve are able to create through pores in each of the molded layers, such as layers 4408 and 4409.

Figure 28:
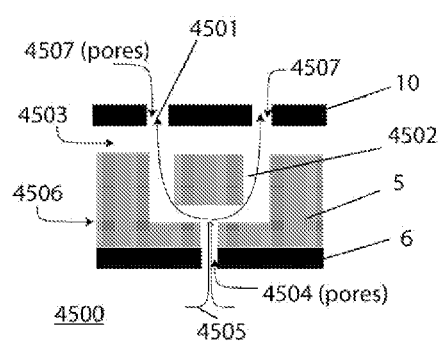
FIG. 28 illustrates a guidable flow method of making molded structure in accordance with some embodiments.

FIG. 28 illustrates a guidable flow method of making molded structure in accordance with some embodiments. The flow that is used to generate pores is able to be guided by sucking the flow through another array of nozzles or orifices. For example, the flow 4501 is able to be sucked by a vacuum into the orifices of the top plate 10. In some embodiments, a space 4503 exists between the top plate 10 and the molding material 5. The bottom molding plate 6 contains the moldable features and the through pores 4504. The flow 4505 is able to go through the pores 4504 by applied vacuum through the holes 4507 on the top plate 10. The flow 4505 passes through the molding material 5, so that the path of the flow 4505 forms a molded structure 4506.

Figure 29:
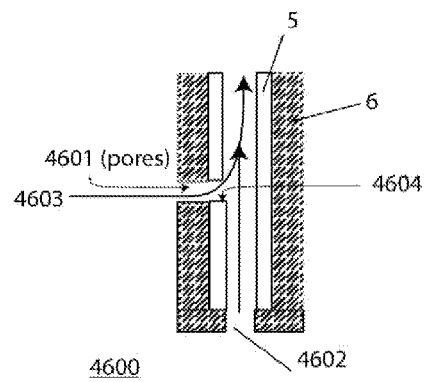
FIG. 29 illustrates a molding system in accordance with some embodiments.

FIG. 29 illustrates a molding system in accordance with some embodiments. The orifice in the molding plate is able to be positioned at an angle to the direction of the flow. For example, the molding plate 6 is able to have pores 4601 located on the walls of the molding plate 6, such that a flow 4603 is able to enter from the pores 4601 to make a hole 4604 on the side wall of the molding material 5. In some embodiments, the molding plate 6 is able to have an orifice 4602 at the bottom of the molding plate 6. A person of ordinary skill in the art will appreciate that one or more orifices are able to be at any location of the molding plate 6.

Figure 30:
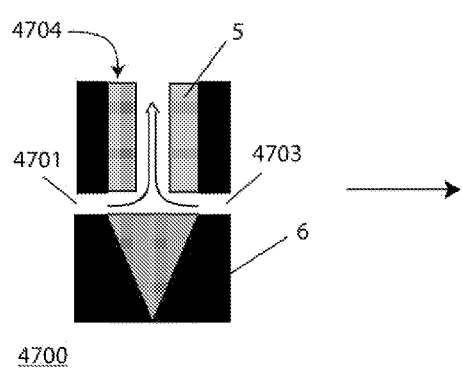
FIGS. 30-31 illustrate a molding structure in accordance with some embodiments.
Figure 31:
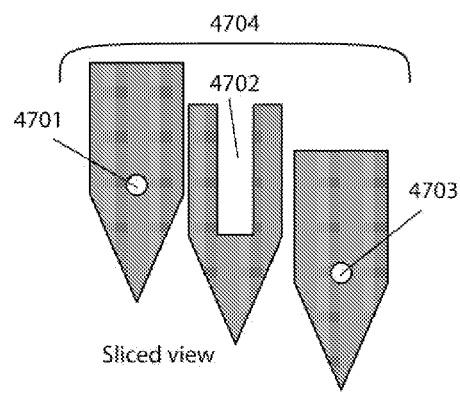

FIGS. 30 and 31 illustrate a molding structure in accordance with some embodiments.

FIG. 30 illustrates that the molding plate with side way orifices is able to have a variety of molding geometries in accordance with some embodiments. The figure shows the structure that represents an array of these structures. The molding cavities are able to form a pyramid shape to create a sharp tip in the final molded structure. As shown, the molding device 4700 is able to have a molding plate 6 having two side way orifices 4701 and 4703. A molded material 5 is filled in the molding plate 6

FIG. 31 illustrates a sliced cross-sectional view of the molded material 4704 of FIG. 30. As shown, the molded material 4704 is removed from the molding plate 6. The molded material 4704 is rotated 90 degrees so that the openings located on the molded material are turned from the left and right sides to the top and bottom sides. The molded material 4704 is able to have a formed opening 4701 of the top side, a channel 4702 formed by the flow traveling through the material during molding, and a bottom opening 4703.

Figure 32:
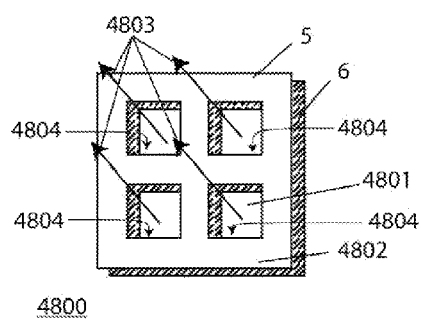
FIGS. 32-33 illustrate a method of making micro ring and micro disk structure in accordance with some embodiments.
Figure 33:
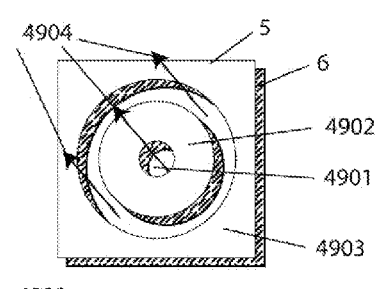

FIGS. 32 and 33 illustrate a method of making micro ring and micro disk structure in accordance with some embodiments.

FIG. 32 illustrates a structure 4800 in accordance with some embodiments. The structure 4800 is able to have a cross or mesh structures 4802 on a molding plate 6. One or more flows 4803 are able to flow through the holes 4804, so that holes 4801 in the molded material 5 are able to be created. In some embodiments, magnetic materials and other active materials are able to be embedded inside the molded structures to create active structures. When an external stimulus is applied, the active structures are able to respond to the stimulus. The response is able be a mechanical movement, a current flow, or a shape change. The arrows 4803 indicate an exemplary direction of flow through the molding plate.

FIG. 33 illustrates a structure 4900 in accordance with some embodiments. The structure 4900 comprises micro rings/micro discs 4902, which are able to be formed by separating the connected parts 4903 in the molded material by the flow through the molding plate 6. The molding plate 6 is able to have parts that connect the center ring to the outer ring. When the flow 4904 is applied, the flow 4904 is able to cut across the connections to completely encapsulate the center ring to be within the flow forming a molded structure 5. The pore 4901 is formed within the micro rings/discs 4902. The arrows indicate the direction of flow 4904 through the molding plate 6.

Figure 34:
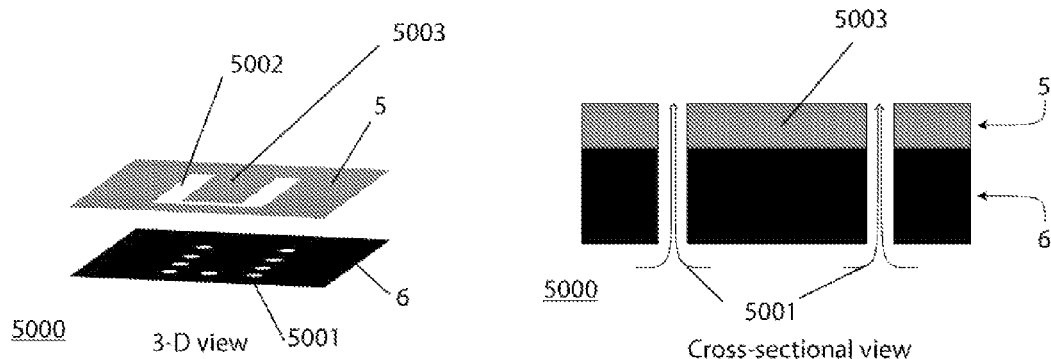
FIG. 34 illustrates a method of forming micro cantilever in accordance with some embodiments.

FIG. 34 illustrates a method of forming micro cantilever 5000 in accordance with some embodiments. The micro cantilever 5000 is able to be produced by using a molding plate 6 with patterned pores. In the molding plate 6, flow is able to come out of the pores 5001 and forms the desired patterns in the molding material 5. The pores in the molding plate are packed to be close enough such that the flow formed in the molding material 5 is able to merge to form a gap 5002 that divides the moving part of the cantilever 5003 from the rest of the molded material.

Figure 35:
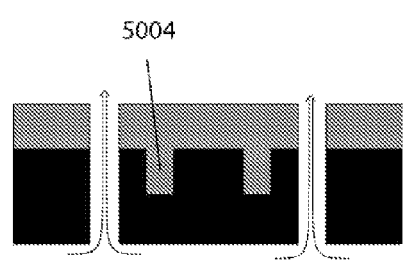
FIGS. 35-38 illustrate the molding plate modifications of the method of forming micro cantilever in accordance with some embodiments.
Figure 36:
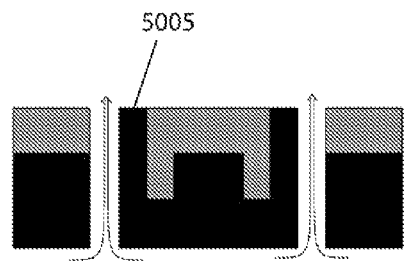
Figure 37:
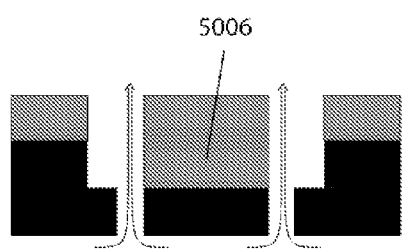
Figure 38:
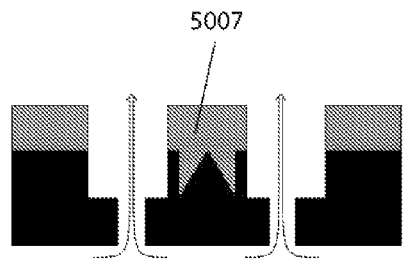

FIGS. 35-38 illustrate the molding plate modifications of the method of forming micro cantilever of FIG. 34 in accordance with some embodiments. FIG. 35 shows that grooves 5004 are able to be used to create standout features in the cantilever. FIG. 36 shows that walls 5005 are able to be used in the molding plate 6 to create the cantilever. FIG. 37 shows the molding plate is able to have an indentation 5006 to cause the increased depth in the molded cantilever. FIG. 38 shows the cantilever region is able to be molded to have a variety of surface geometry 5007.

Figure 39:
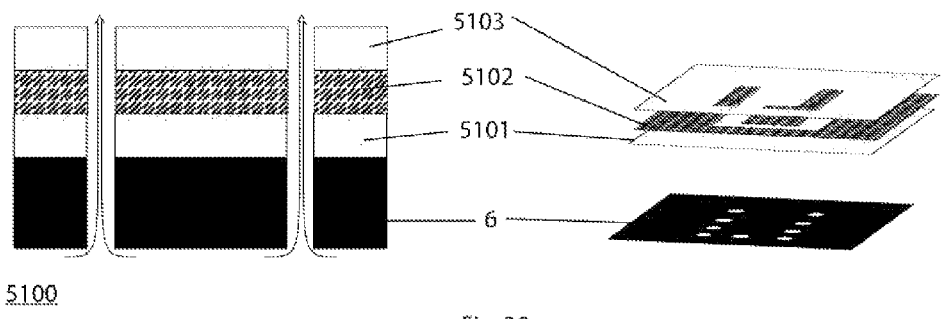
FIG. 39 illustrates a self-aligned molding system in accordance with some embodiments.

FIG. 39 illustrates a self-aligned molding system 5100 in accordance with some embodiments. The self-aligned molding system 5100 is able to mold multiple different materials in a self-aligned fashion using the same molding plate 6 (FIG. 34). Layer 5101 is able to solidify to become the molding plate for layer 5102, and layer 5102 is able to solidify to become the molding plate for layer 5103. Sacrificial material is able to be used as a molding material. The sacrificial material is able to be removed later on to create gaps within the molded device.

Figure 40:
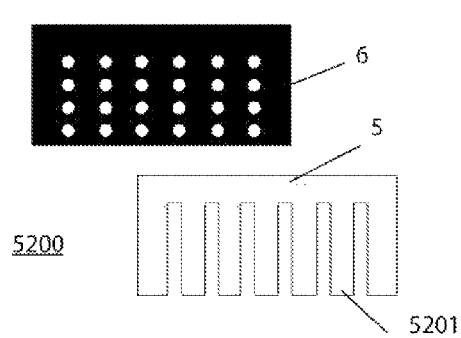
FIGS. 40 and 41 illustrate a method of creating an array of cantilevers in accordance with some embodiments.
Figure 41:
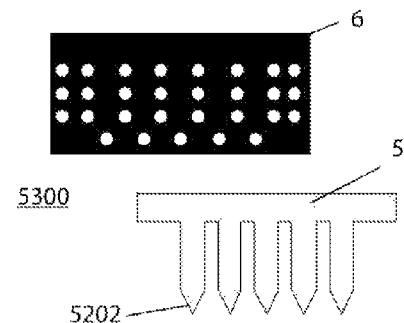

FIGS. 40 and 41 illustrate a method of creating an array of cantilevers in accordance with some embodiments. A porous molding plate 6 is able to be used to create an array of cantilevers out of the molded material 5. In some embodiments, the tip 5201 of the cantilever is able to be flat. In some other embodiments, the tip 5202 of the cantilever is able to be sharp.

Figure 42:
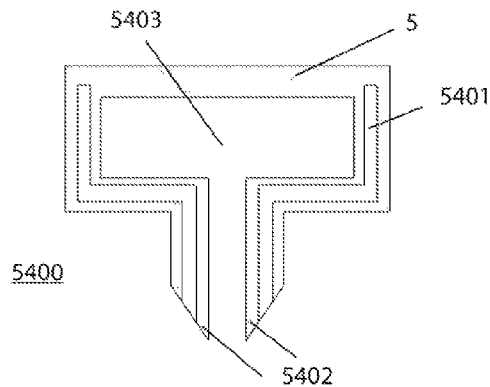
FIGS. 42 and 43 illustrate a method of creating a molded structure in accordance with some embodiments.
Figure 43:
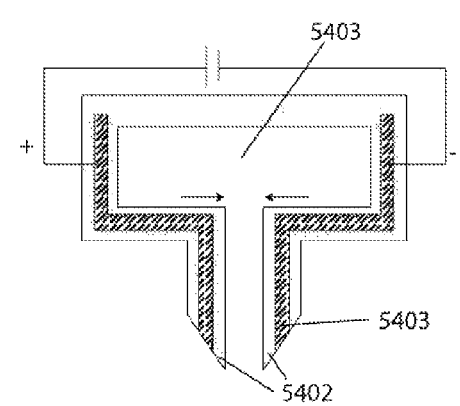

FIGS. 42 and 43 illustrate a method of creating a molded structure in accordance with some embodiments. The molded structure is able to be a pair of micro tweezers 5400. The micro tweezers comprise at least two micro-cantilevers 5402 joined together. The two cantilevers are separated by the gap 5403, which is able to be created by the flow out of the pores in the molding plate. The at least two micro-cantilevers 5402 contain indentations 5401 that are able to be filled with conductive materials or other materials that are able to be sensitive to controlled stimulus. In FIG. 43, when the indentations 5401 are filled with an electrically conductive material, the charging of the pair of conductive bands 5403 with opposite charges cause the tweezers to come together due to the electrostatic forces.

FIGS. 44 and 45 illustrate a method of creating a molded structure that is able to change into a coil in accordance with some embodiments.

FIG. 44 illustrates a method of creating a molded structure using the device 5500 in accordance with some embodiments. The molded structure is able to be a long cantilever structure that contains various cavities and channels. Cavities 5501 and 5503 and channels 5502 and 5504 are able to be filled with different materials. The cavities are able to be smaller than the width of the cantilever and the channels are able to shorter than the length of the cantilever. The cantilevers are able to have a width of one micrometer to several hundred micrometers. The length of the cantilever is able to range from less than 1 micrometer to more than several centimeters (cm).

FIG. 45 illustrates a method of creating a coiled molded structure in accordance with some embodiments. The cavities 5501 and 5503 and channels 5502 and 5504 of the device 5500 are able to be filled with a conductive material. In some embodiments, the channel 5502 and cavities 5501 are charged with a negative voltage and the channel 5504 and cavities 5503 are charged with a positive voltage. The attraction of opposite charges causes the structure to coil.

FIGS. 46 and 47 illustrate multi-layered nozzles created in accordance with some embodiments. In FIG. 46, the multi-layered nozzles are able to be created by using a flow 6018 to create pores 6019 inside molded structures 6000. In some embodiments, the bottom layer 6001 is first molded out of a molding plate and then used as the molding plate for molding layers 6002 and 6004. Layers 6001 and 6004 are able to be bonded together along the edges of the two structures. Layer 6002 is able to be made of a sacrificial material, which upon removal creates a gap between layers 6001 and 6004. Feature 6003 shows that the tip of nozzle in the multi-layered structure is able to be a standout feature. Through holes 6006 and 6005 are both created by the flow through the pores. Gap 6007 is able to be controlled by the thickness of layer 6002. The thickness of the layers is able to be controlled by the volume of materials deposited, coated, or injected onto the surface of the molding plate. A person of ordinary skill in the art will appreciate that any thickness of the layer 6002 is applicable. In some embodiments, the thickness is able to be adjusted by spinning the molding materials down to the desired thickness before solidifying. The thickness of each layer is able to be as thin as thinner than 1 nm to several millimeters, such as from 0.1 nm to 10 mm.

FIG. 47 illustrates three layered nozzles created in accordance with some embodiments. Additional layers 6010 are able to be added on top of new sacrificial layer 6009. Removal of the sacrificial layer 6009 creates gap 6011. A person of ordinary skill in the art will appreciate that any number of layers are able to be created using the creation method described above.

FIGS. 48 and 49 illustrate a method of generating encapsulated compounds in accordance with some embodiments. In FIG. 48, multi-layered nozzles 6020 are able to be used to generate encapsulated compounds. Materials such as fluids, mixture of particles and fluids, and polymer mixtures are able to be used to encapsulate drugs, chemicals, biological materials, and other compounds. In some embodiments, fluidic layer 6012 is immiscible to fluidic layer 6013, and fluidic layer 6013 is immiscible to fluidic layer 6014. Fluid layer 6012 is injected through nozzle 6016 and through subsequent pores in layer 6019. When the fluid layer 6012 travels up, the fluid layer 6012 encounters the fluidic layer 6013 at the outlet of the nozzle 6016. The fluid layer 6012 is sandwiched by the fluidic layer 6013. When the fluid layer 6012 continues to go up, the fluidic layer 6014 encapsulates the fluid layer 6013 and fluid layer 6012 forming a capsule 6015. The capsule 6015 is able to have the fluid layer 6012 in the inner core surrounded by the fluid layer 6013, which is surrounded by the fluid layer 6014. The multi-layered capsule is able to comprise a blend of polymeric materials which are able to later solidify into hard shield to further stabilize the multi-layered compound 6015. The capsule is able to be created inside another fluid by immersing the multi-layered nozzles inside the fluid. A person of ordinary skill in the art will appreciate that any numbers of layers are applicable. Solid material is able to be encapsulated by blending solid material into one of the fluid layers.

FIG. 49 illustrates a variation of the multi-layered nozzles 6018 of FIG. 48. The multi-layered nozzles 6018 have an inner nozzle 6017. The nozzle 6017 is able to comprise a flat orifice.

FIG. 50 illustrates a 3-D view of the multi-layered nozzle 6018 (FIG. 48) formed by the additive layering process described above.

FIGS. 51-56 illustrate a method of making a nozzle within nozzle structures in accordance with some embodiments.

FIG. 51 and FIG. 52 illustrate the processing steps used to make a concentric nozzle in accordance with some embodiments. In some embodiments, a concentric nozzle has a nozzle within the nozzle geometry. In FIG. 51, structure 6100 is able to be a molding material created from a molding plate. Structure 6100 contains one or more channel 6101, a cavity 6108 (FIG. 52), one or more channels 6103, and cavity 6109 (FIG. 52). The shaded material comprises a sacrificial material that is able to be removed later. In the first figure of FIG. 51, the sacrificial materials are first filled into channels 6102 and later the molding material is then filled into the channel to cover up the sacrificial material. Both the sacrificial material and the molding material are injected into inlet 6102 to flow into the circular channel 6101. The filling of the channels with first a sacrificial material and then later with a molding material is performed while the flow 6110 is flowing through the middle pore located in the center of the nozzle. In the second figure of FIG. 51, a sacrificial material is filled into 6103 from inlet channel 6104. The cross-section of the second figure in FIG. 51 is shown as FIG. 52. Since the flow 6110 continues to flow through the central pore while the molding material is filled onto the sacrificial material, the flow 6110 fills into cavities 6108 and 6109, which keeps the molding material from the complete covering of the sacrificial material around the pore 6111 (FIG. 52). In the third figure of FIG. 51, the molding material is filled into channel 6103 from inlet 6104. The flow 6110 through the pore 6111 (FIG. 52) keeps the molding material from completely sealing up the sacrificial material.

FIG. 53 illustrates the produced nozzle device for making droplets and multi-layered droplets in accordance with some embodiments. FIG. 53 comprises a cross-sectional view of the structure 6100 with the sacrificial layers removed and channels filled with different fluids. Similar to device 6018 (FIG. 48), different fluids 6105, 6106, and 6107 are able to be filled into the different channels to produce droplets and multi-layered droplets.

Figure 54:
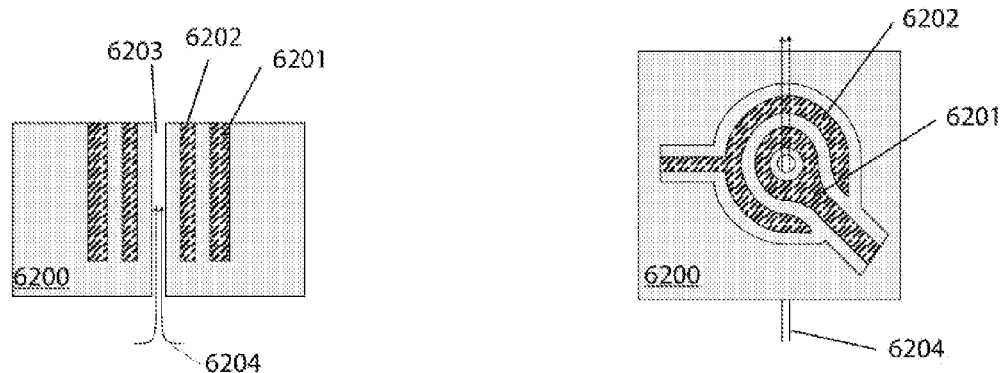

FIG. 54 illustrates another variation of the concentric nozzle in accordance with some embodiments. Similar to the examples shown in FIG. 51, the channels 6202 and 6201 that surround the central pore 6203 are first filled with a sacrificial material and later sealed with a molding material. The variation in the concentric nozzle 6200 shows that the channels 6202 and 6201 within the molded concentric structure 6200 are able to be channels of equal depth. The channels 6202 and 6201 are filled with a sacrificial layer first to allow sealing of the channels by another layer of molding material. The subsequent removal of sacrificial layer is able to create channels that are able to be filled with solutions.

Figure 55:
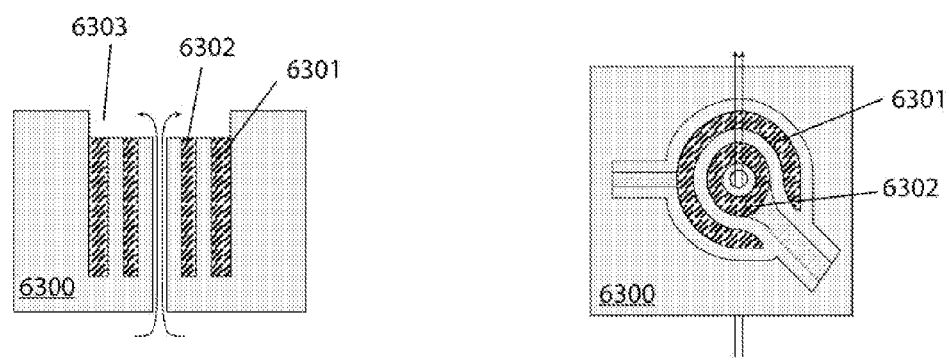

FIG. 55 illustrates another variation of concentric nozzle design in accordance with some embodiments. In some embodiments, structure 6300 contains an extra cavity 6303, which is located with the molded layer 6300. In the concentric nozzle designs including structures 6100, 6200, and 6300, the amount of flow passing through the pores is able to be used to control the area of coverage by the molding materials onto the sacrificial layers.

Figure 56:
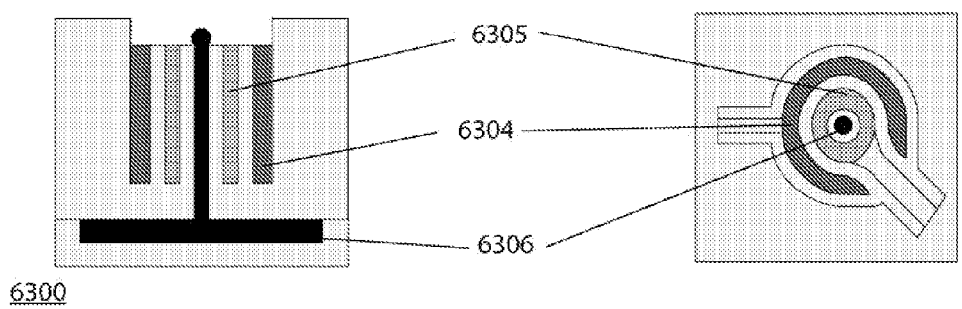

FIG. 56 illustrates the application of concentric nozzle device 6300 in accordance with some embodiments. In some embodiments, different fluids 6306, 6304, and 6305 are filled into the respective channels. The fluids are able to be ejected out of the nozzle. The nozzle designs presented here are able to exist as an array of nozzles in the device. The dimensions of the nozzles are able to be as small as hundreds of nm to several millimeters.

Figure 57:
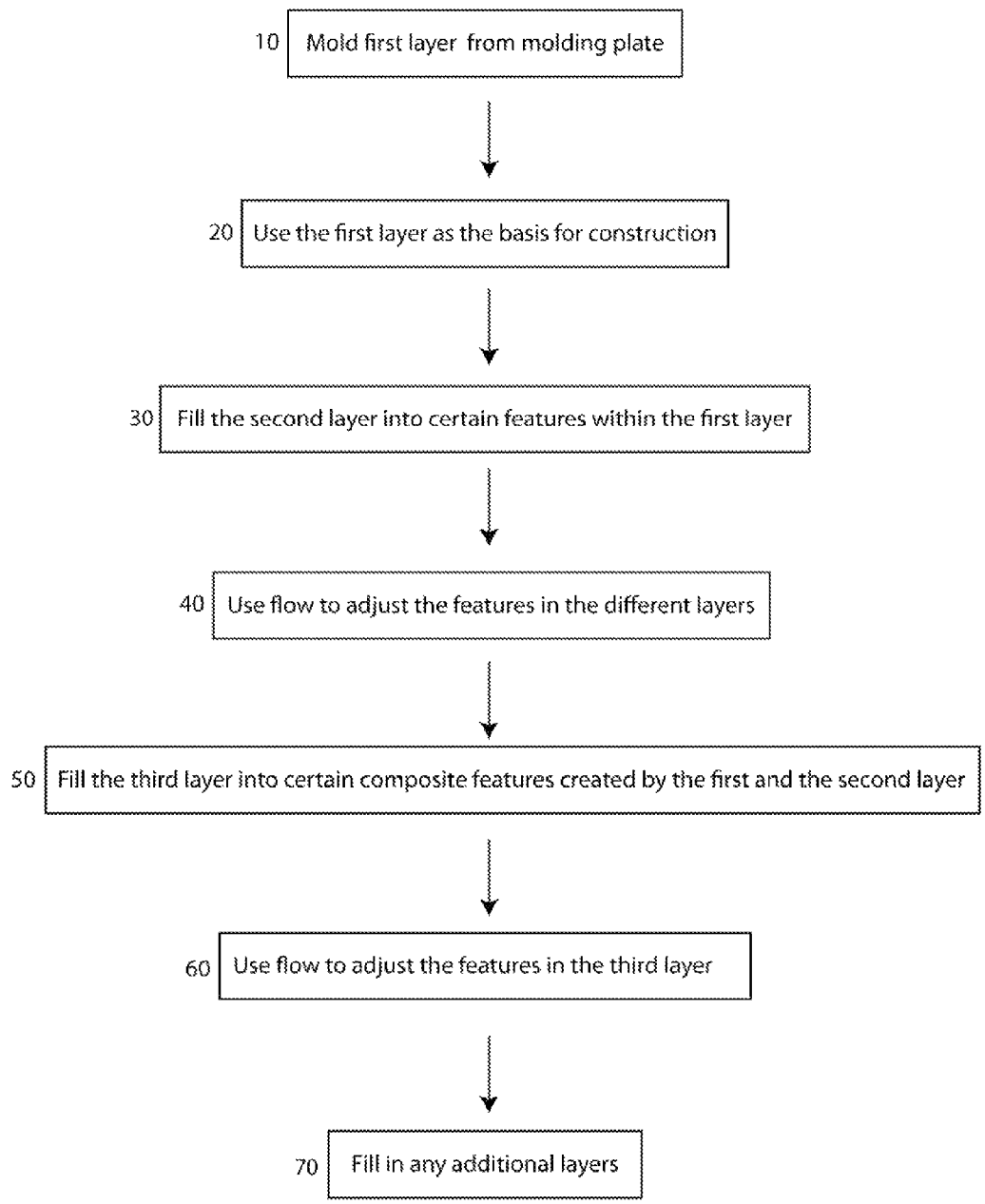
FIG. 57 illustrates a flow chart illustrating the process of making multi-layered features with an embedded structure in accordance with some embodiments.

FIG. 57 is a flow chart illustrating the process of making multi-layered features with an embedded structure in accordance with some embodiments. In Step 10, a first layer is molded from the molding plate. In Step 20, the first layer is used as the basis for construction. In Step 30, a second layer is filled into certain features within the first layer. In Step 40, the feature in the formed layers is adjusted by using flow. In step 50, a third layer is filled into certain composite features created by the first and the second layers. In Step 60, the features in the third layer are adjusted. In Step 70, additional layers are filled in.

FIGS. 58-62 illustrate a method of building a multi-layer structure in accordance with some embodiments.

Figure 58:
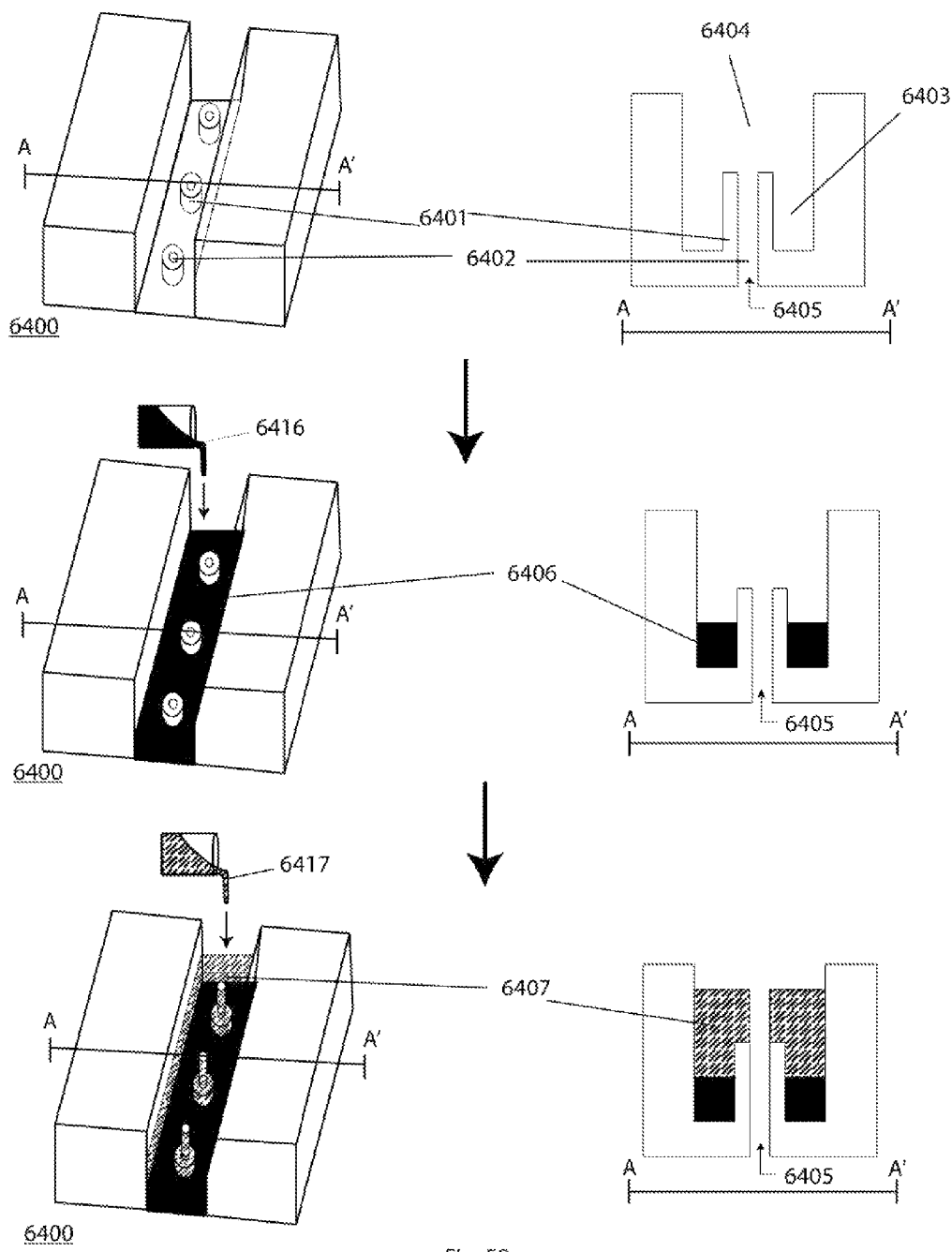
FIGS. 58-62 illustrate a method of building a multi-layer structure in accordance with some embodiments.

FIG. 58 illustrates a method of building a multi-layer structure in accordance with some embodiments. The drawings at left side comprise a 3D view of a base structure 6400, and the drawings at right side comprise cross-sectional views of the system 6400 along line A-A'. The base structure 6400 is able to be molded from a molding plate. In some embodiments, the base structure 6400 has embedded through pores 6402, embedded nozzles 6401, embedded channels 6403, and embedded opening 6404. Next, the second layer of molding material 6416 is filled into 6403 to create structure 6406. The filling of material is performed while a flow stream 6405 is flowing through 6402. After the molding material 6416 solidifies, new molding material 6417 is able to be poured into the embedded opening 6404 to create a structure 6407.

Figure 59:
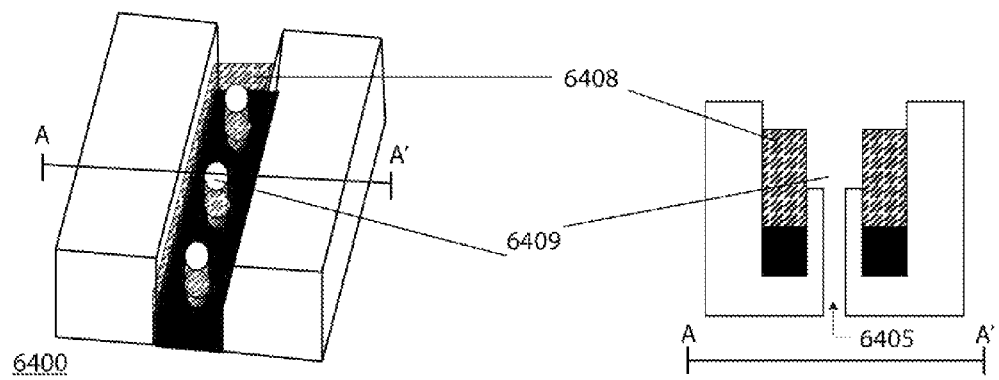

FIG. 59 illustrates a method of building a multi-layer structure in accordance with some embodiments. The cross-sectional view at right is taken along the line A-A' from the drawing of 3D view at left side. The method described in FIG. 59 is able to be similar to the method described in FIG. 58. By controlling the magnitude, the velocity, and the material property of the flow stream 6405, the flow stream 6405 is able to be controlled (e.g. higher flow rate and/or specific flow direction) to force the third layer of molding material to shape into structure 6408 and cause the formation of channel 6409.

Figure 60:
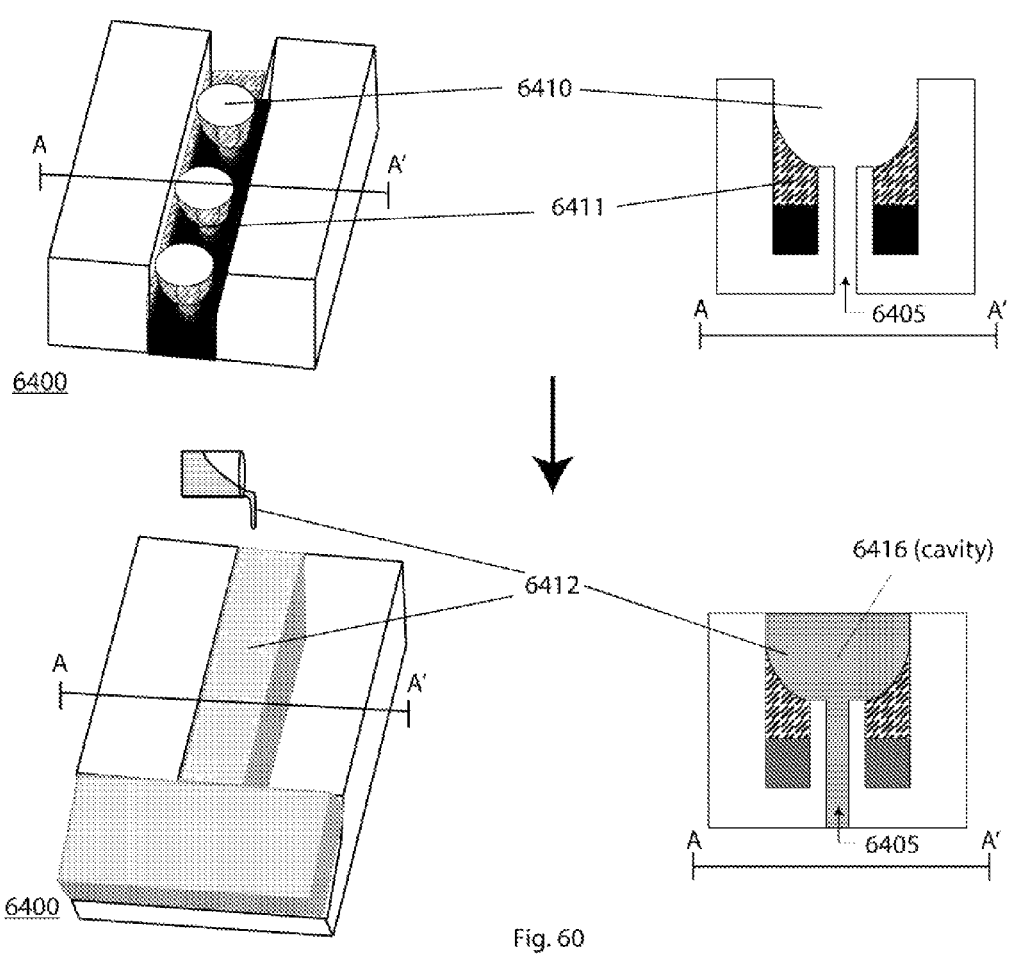

FIG. 60 illustrates another method of building a multi-layer structure in accordance with some embodiments. The cross-sectional view at right is taken along the line A-A' from the drawing of 3D view at left side. The formation of pores 6410 and structure 6411 are able to be created by passing a flow stream through pores 6405. In some embodiments, a molding material 6412 is able to be filled into the formed structure 6416.

Figure 61:
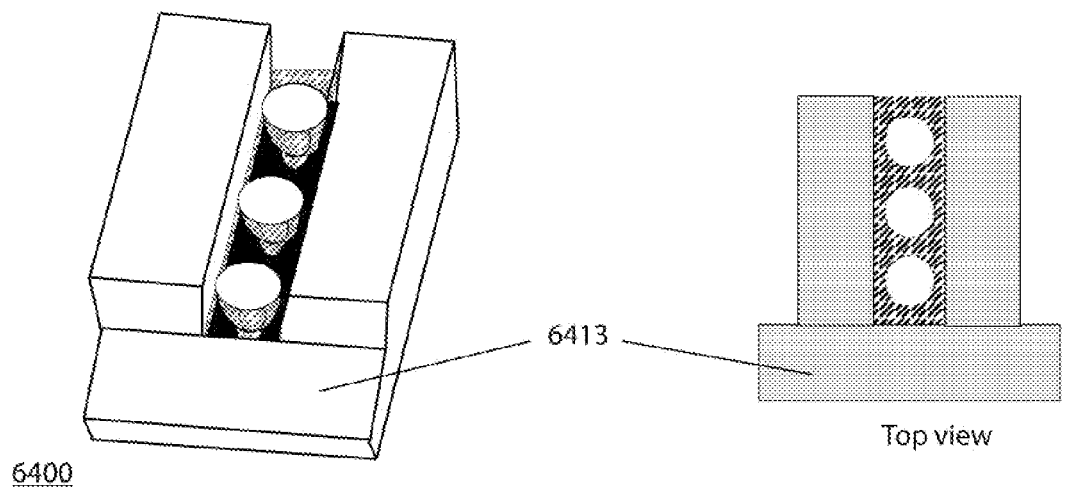

FIG. 61 illustrates an extended view of a structure 6400 in accordance with some embodiments. A channel 6413 is able to run parallel to the channel containing the three nozzles. Channel 6413 is able to be at different height and different depth than the channel containing the nozzles.

Figure 62:
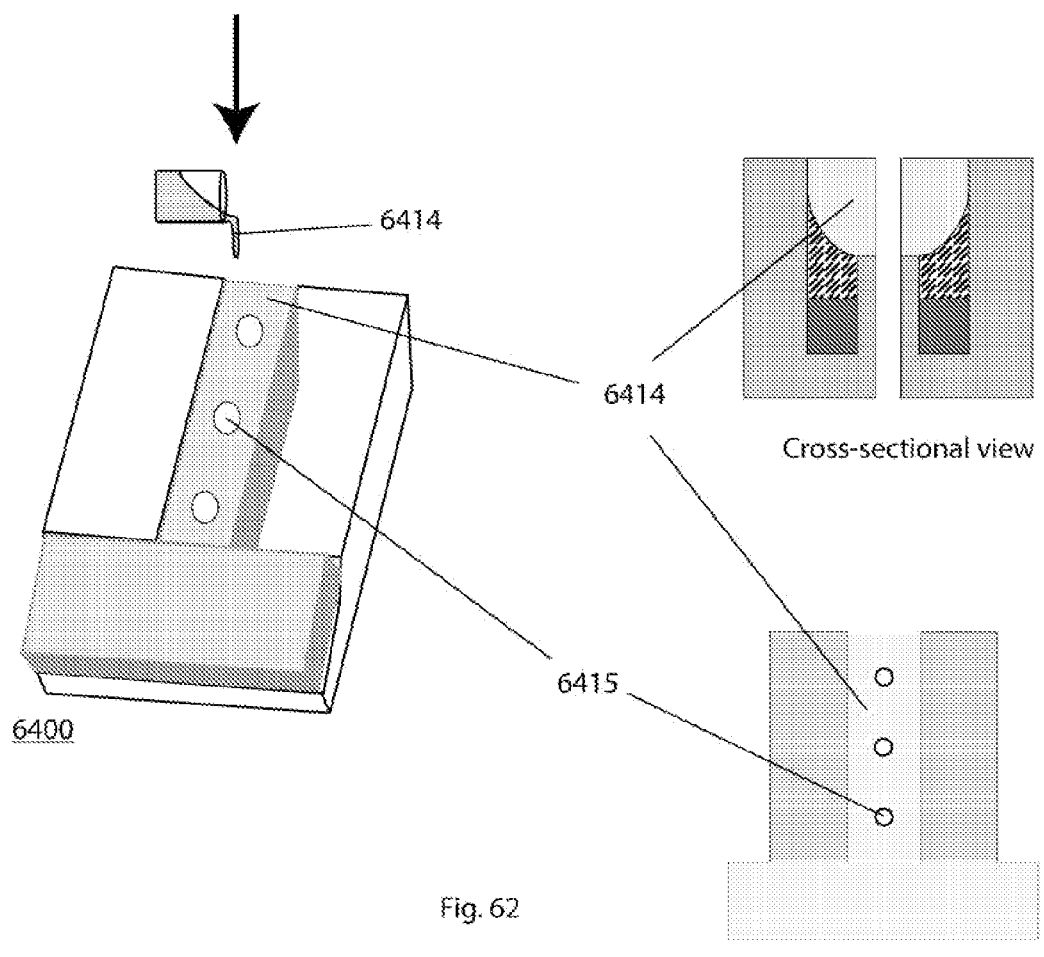

FIG. 62 illustrates a pore creation method in accordance with some embodiments. A molding material 6414 is able to be filled into the channels 6413 (FIG. 61) created using the method described in FIG. 61. Pores 6415 are able to be created by activating a flow through the pores in 6400.

Figure 63:
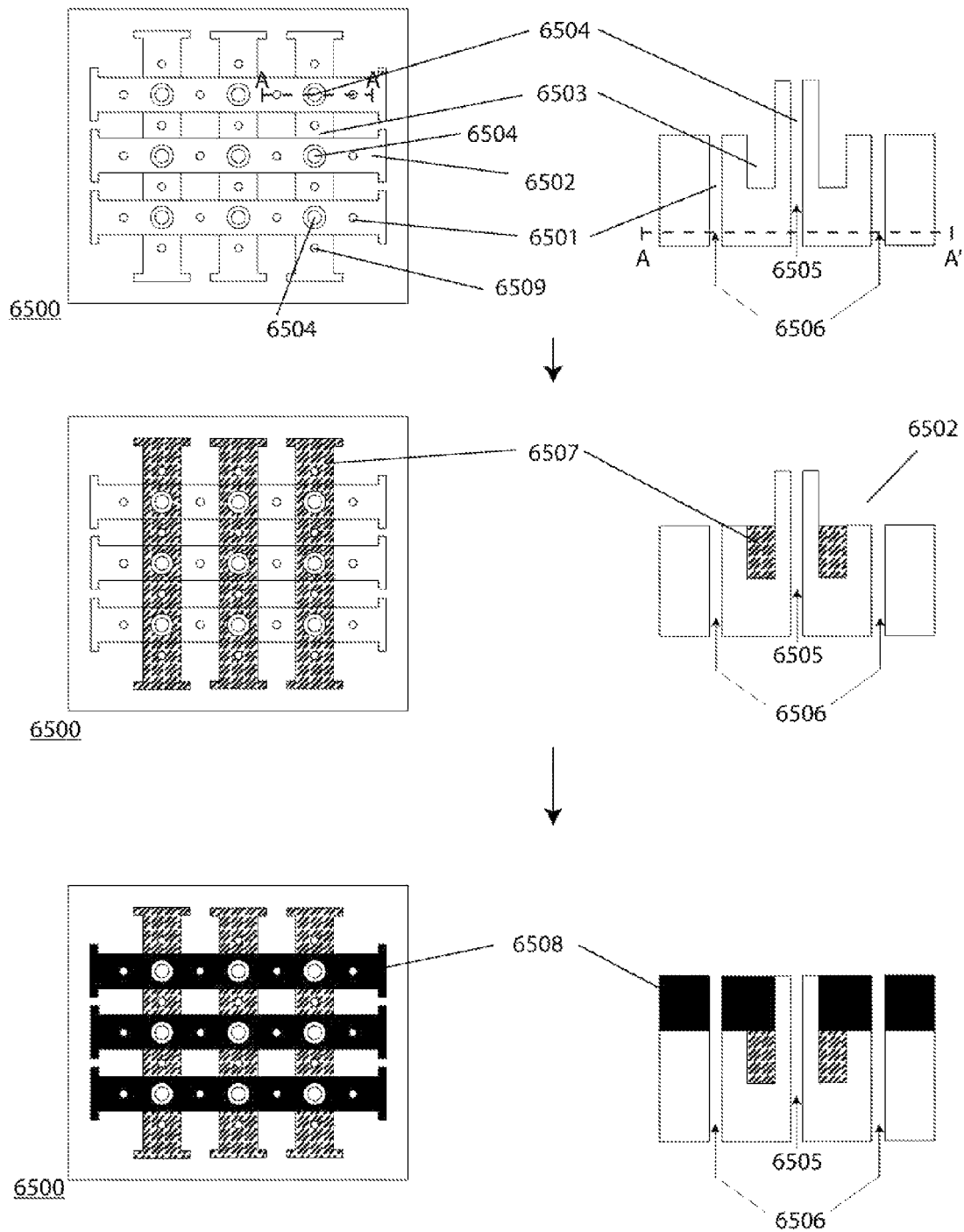
FIGS. 63-66 illustrate the creation of a large array with inter crossing layers of structures in accordance with some embodiments.

FIGS. 63-66 illustrate the creation of a large array with inter crossing layers of structures in accordance with some embodiments. FIG. 63 shows the top view and the cross-view of a structure 6500. The cross sectional view at right side is taken along the line A-A' of the top view at left. The structure 6500 is able to be molded from a molding plate with pores. Similar to the method of making the structure 6400 (FIGS. 58-62), the structure 6500 is able to be further constructed by adding molding material into different embedded features. Pores 6504 are the central through pores. Pores 6501 are through pores that are located within the same height level as pores 6504. Pores 6509 are located at different height level to 6505. Flow 6505 is applied through 6504 and flow 6506 is applied through 6501. Flows 6505 and 6506 are able to be derived from the same source, different sources, and/or independent sources. Openings 6502 are the openings or cavities within the plane. Channels 6503 are channels or cavities. Molding material is able to be added into 6503 to form structure 6507. Another molding material is able to be added into 6502 to form feature 6508.

Figure 64:
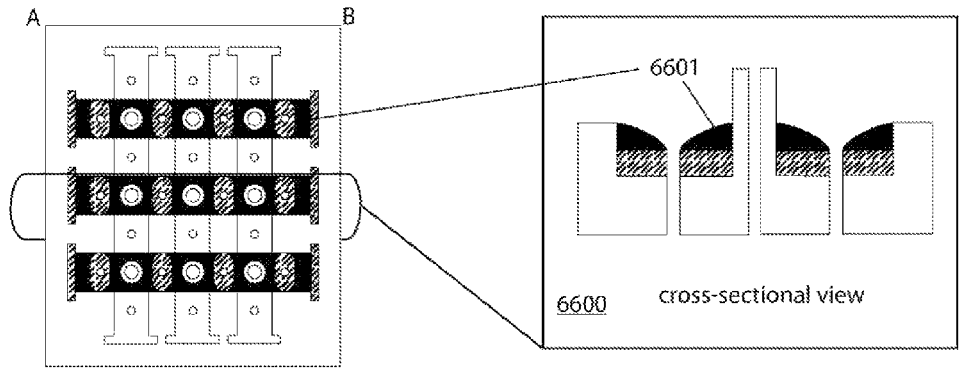

FIG. 64 shows a structure 6600, which is a variation of the structure 6500. Structure 6600 has an angled layer 6601. In structure 6600, the horizontal rows and the vertical columns are able to have different type of cross-sections.

Figure 65:
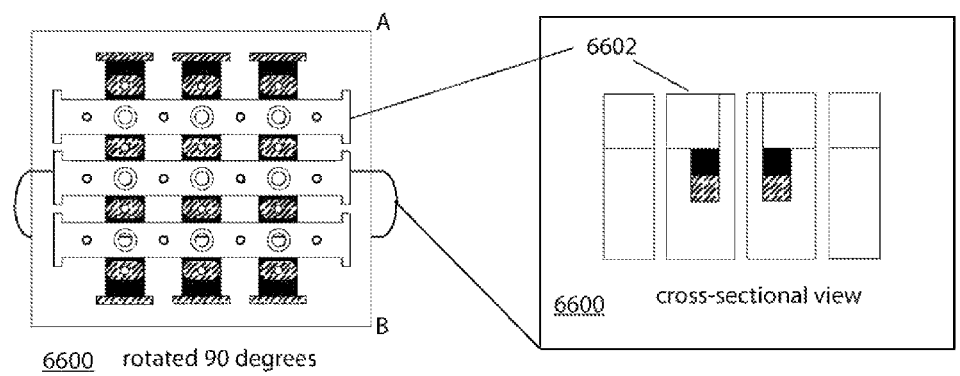

FIG. 65 illustrates that a molding material is filled onto the top of the angled layer 6601 (FIG. 64). When the structure 6600 is rotated 90 degrees, another cross-section is revealed.

Figure 66:
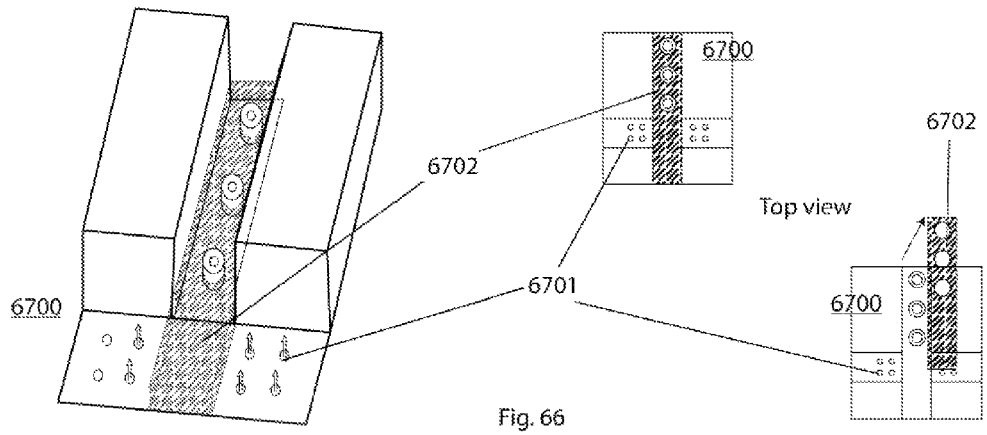

FIG. 66 illustrates that flow through pores 6701 are able to be used to shape the new layer of molding material 6702 by preventing the molding material 6702 from flowing onto the areas surrounding pores 6701. In some embodiments, the molding material 6702 is able to be removed from 6700 when the molding material solidifies.

Figure 67:
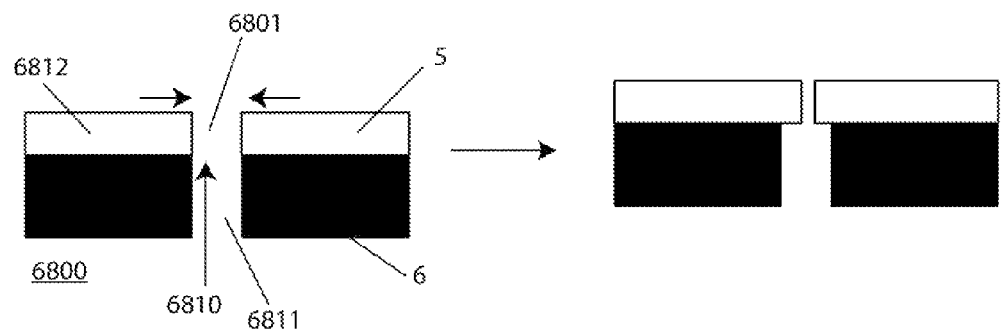
FIGS. 67-69 illustrate a method of making a membrane in accordance with some embodiments.
Figure 68:
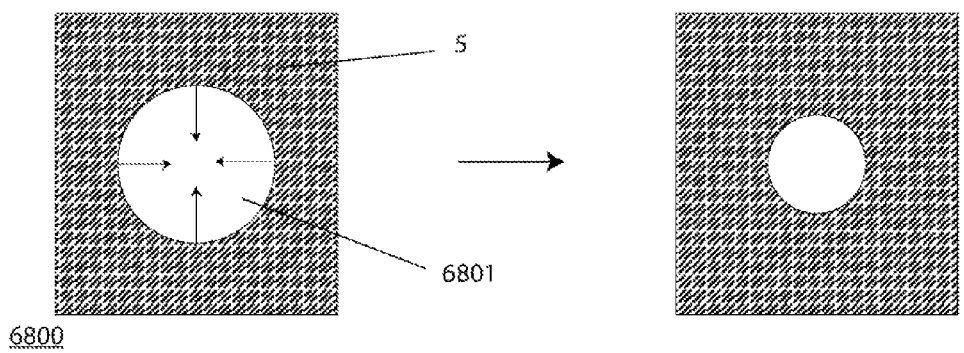
Figure 69:
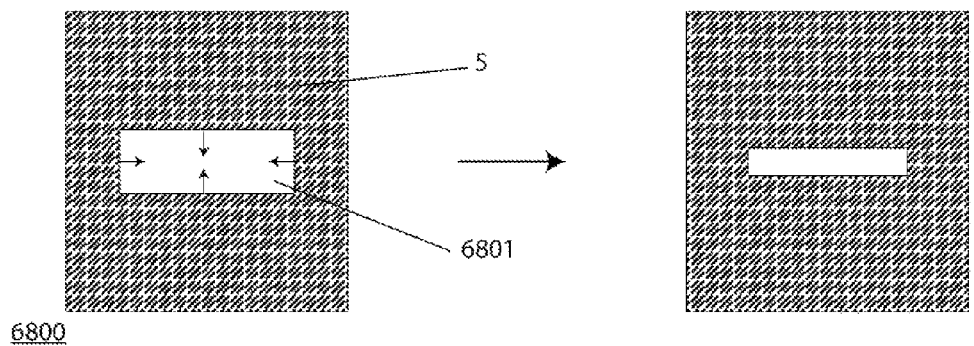

FIGS. 67-69 illustrate a method of making a membrane in accordance with some embodiments. In some embodiments, a gas stream 6810 is kept at a constant pressure (e.g. 0.1 psi to 10 kpsi) going through the pores 6811. Next, a molding material 5 is poured from the top of the molding plate 6 to form a membrane 6812. The membrane material 6812 is able to be a material that is able to shrink or expand when activated by external stimulus. The stimulus is able to be an electrical signal, a thermal change, the introduction of a chemical, and compression by another material. The shrinkage or the expansion of the membrane is able to cause the pores 6801 within the membrane 6812 to change shape as shown in FIG. 68 and FIG. 69.

Figure 70:
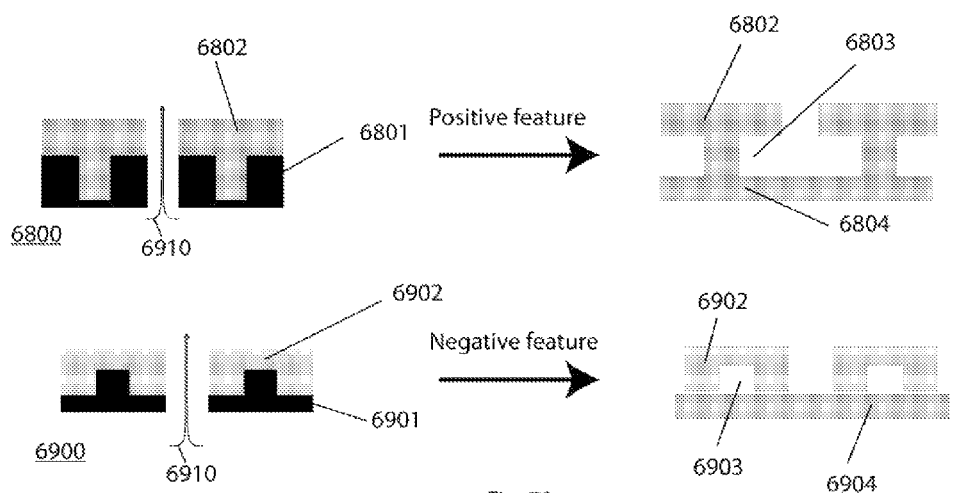
FIGS. 70-72 illustrate the formation and application of nano filters in accordance with some embodiments.
Figure 71:
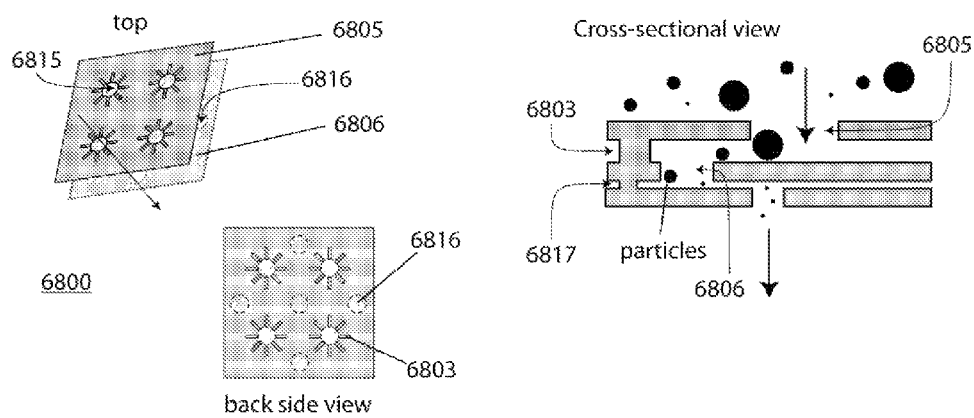
Figure 72:
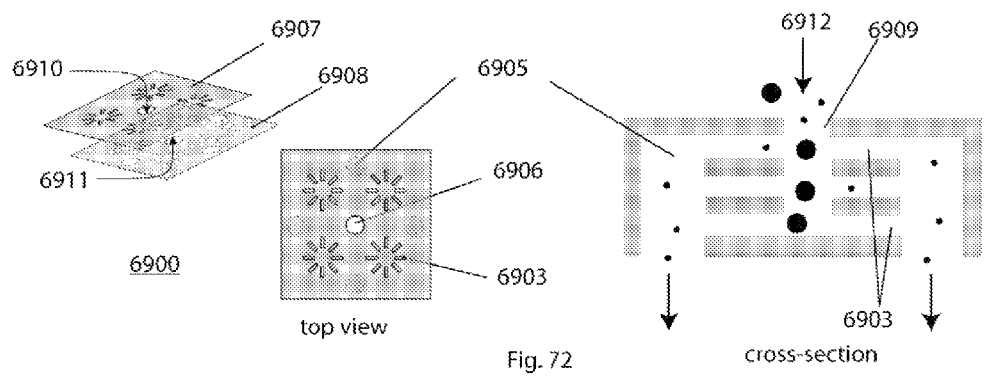

FIGS. 70-72 illustrate the formation and application of nano filters in accordance with some embodiments. FIG. 70 shows two types of systems, including positive feature system 6800 and negative feature system 6900. Both positive feature system 6800 and negative feature system 6900 use the flow 6910 flowing through molding plate 6801 to form membranes 6802 and 6902. The membrane 6802 is molded from the molding plate 6801. The positive feature system 6800 is able to generate positive features in the membrane 6802 forming the nano gap 6803 when the membrane 6802 is bonded to a base membrane 6804. The negative feature system 6900 is able to generate negative features. The negative features of the membrane 6902 form the nano-gap when the membrane 6902 is bonded to a base membrane 6904. The height of a support 6803 and a hole 6903 are able to be in the range of angstroms to hundreds of nanometers, such as 0.2 nm-200 nm.

FIG. 71 illustrates nano fluidic filters in accordance with some embodiments. The nano fluidic filter is able to be made by assembling multi layers of molded materials. The molded materials are able to be manufactured by using the methods described above. The top fluidic layer 6805 comprises through pores 6815. The second layer 6806 comprises through pores 6816. In some embodiments, the through pores 6815 in the top fluidic layer 6815 are aligned away/off-set from the pores 6816 in the second layer 6806. When performing filtration, a solution is able to be poured at the top fluidic layer 6805, particles (filtrates) with a size smaller than the pore 6805 are able to travel vertically through the pores 6805 and then be filtered horizontally through the nano-gaps 6803 as shown in the cross-sectional view. A person of ordinary skill in the art will appreciate that the size of the nano-gaps 6803 are adjustable to any sizes desired. The nano-gaps between layers are able to have different sizes. For example, the nano-gap 6803 between the top fluidic layer and the second fluidic layer is able to be larger than the nano-gap 6817 between the second fluidic layer and the third fluidic layer. Further, any numbers of layers of the molded material are applicable. Furthermore, any applied external forces are able to be applied to facilitate the filtration. For example, a voltage, such as 0.5V, is able to be applied, so the particles with charges are able to travel faster. The nano fluidic filters are able to be applied in various fields. For example, the nano fluidic filters described above are able to form the filter of a chromatography column for HPLC (high-performance liquid chromatography).

FIG. 72 illustrates a nano fluidic device in accordance with some embodiments. The fluidic device is able to comprise a top layer 6907 that is bonded to one or more secondary layers 6908. The opening 6910 in the top layer is aligned to one set of openings 6911 in the secondary layer. Together the alignment of pores 6910 and 6911 forms a long straight pore 6906. The secondary layers contain another set of pores 6905 which is not aligned within the top layer but the pores 6905 are aligned with the respective pores within each of the secondary membranes 6908. This filtration design maximizes the filtration area to allow filtration through the gap 6903. The cross-sectional view of 6900 shows how fluids 6912 are able to be filtered in this design. The fluid 6912 travels first through 6909, through the nano-gaps 6903 horizontally, through 6905 vertically, and lastly out of the bottom of the fluidic structure.

Figure 73:
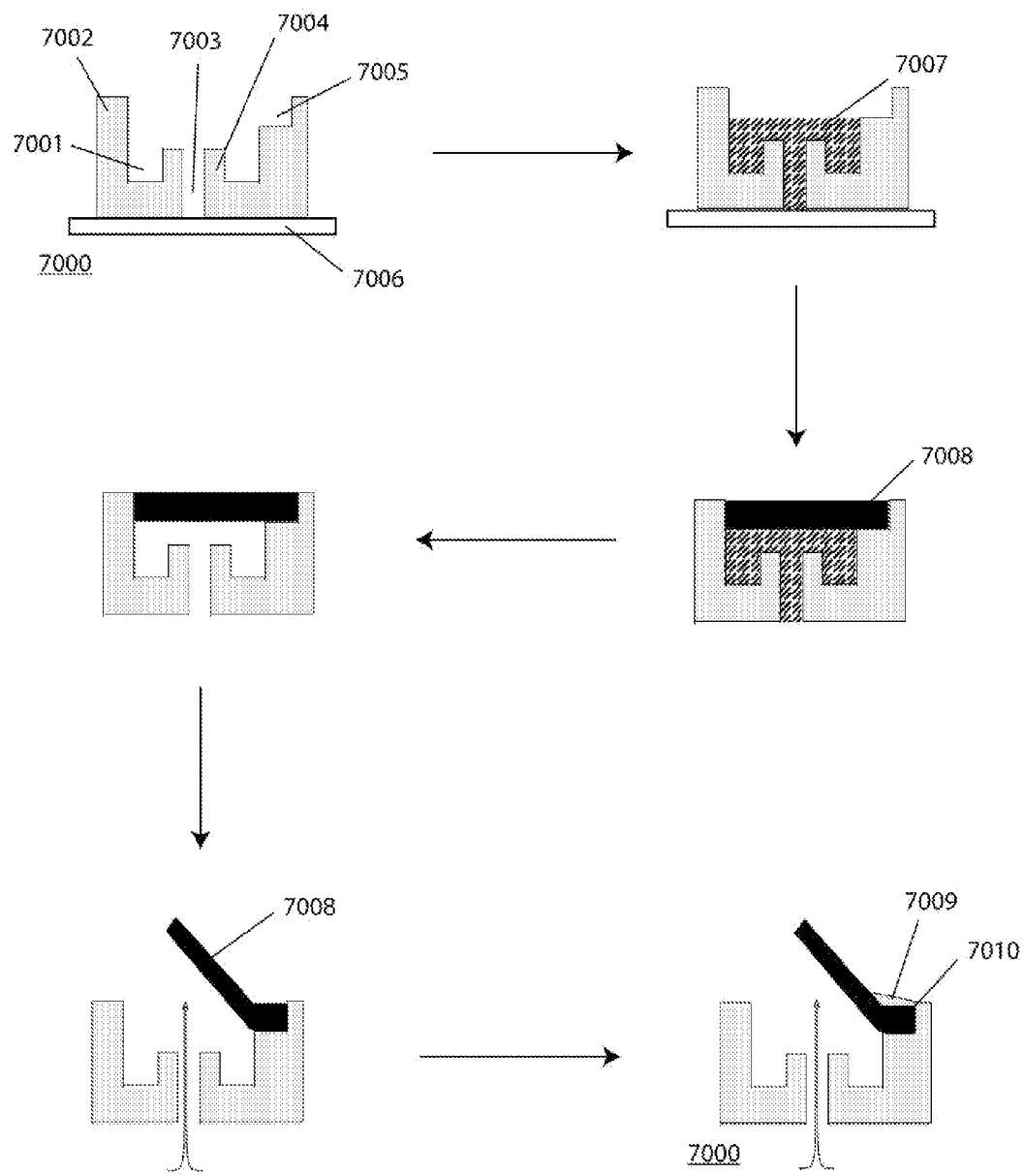
FIG. 73 illustrates the processing steps for making an array of micro valves in accordance with some embodiments.

FIG. 73 illustrates the processing steps for making an array of micro valves in accordance with some embodiments. The bottom of the molded structure 7000 is sealed against another surface 7006. The surface is able to be another fluid, a gel, a sticker, or another object that is temporarily bonded to the molded structure 7000. Structure 7000 contains cavity 7001, side wall 7002, through pore 7003, nozzle 7004, and channel 7005. Once the bottom of 7000 is sealed, a sacrificial material 7007 is able to be filled into the cavities 7001 and 7003. When the sacrificial material 7007 solidifies, another molding material 7008 fills the top of the sacrificial material. When this new molding material solidifies, the sacrificial material 7007 is able to be removed. The material 7008 now forms the valve of the nozzle. Through blowing a flow through the pores, the newly formed valve is able to flap up. While in the flapped up state another molding material 7009 is able to be filled onto the necking region 7010 of the valve. Once material 7009 has been solidified, the motion of the valve 7008 is able to be fixed.

Figure 74:
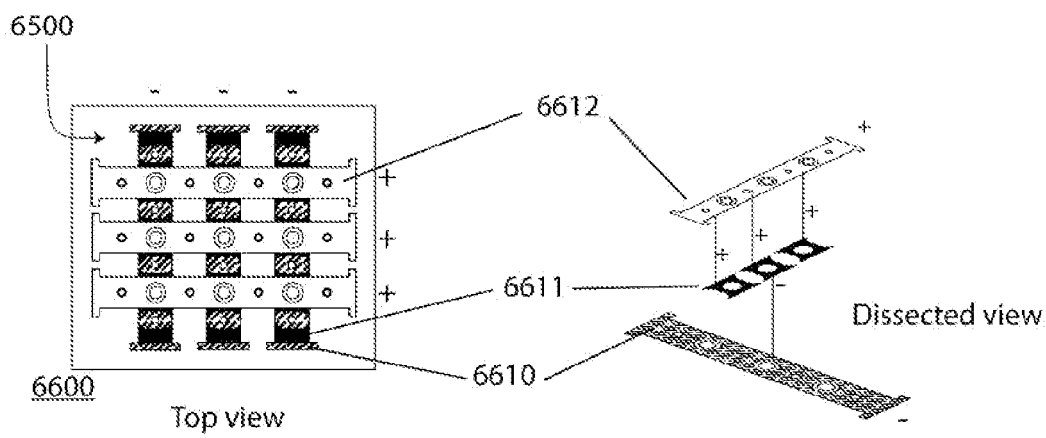
FIG. 74 illustrates an electrical nozzle system in accordance with some embodiments.

FIG. 74 illustrates an electrical nozzle system 6600 in accordance with some embodiments. The electrical nozzle system 6600 comprises a structure 6500 (FIG. 63) connected to different electrodes. Layer 6610 is able to be made of an electrically conductive material, layer 6611 is able to be made from an electro-active material or an electrically insulated material, and layer 6612 is also able to be made out of an electrically conductive material. When layer 6610 and 6612 are charged, the electroactive layer 6611 will be activated, which will be able to exert an effect on the objects inside the pores. For example, the effect is able to be a mechanical motion, a change in electrostatic charges, and other physical or chemical effects. A person of ordinary skill in the art will appreciate that any effect that is able to be caused by replacing layer 6610 with different electro-activated materials is applicable.

Figure 75:
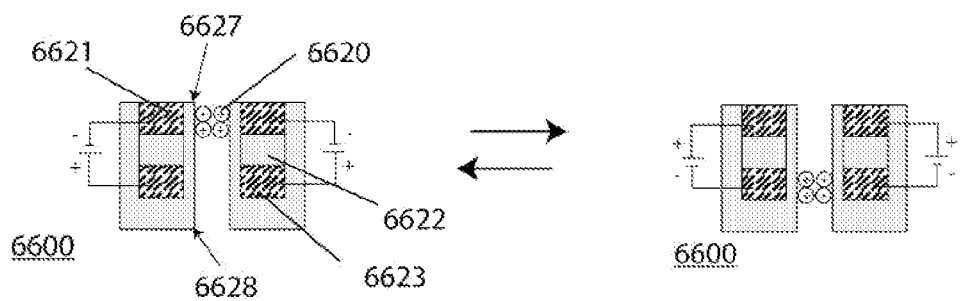
FIGS. 75 and 76 illustrate electrically controllable electrostatic beads in accordance with some embodiments.
Figure 76:
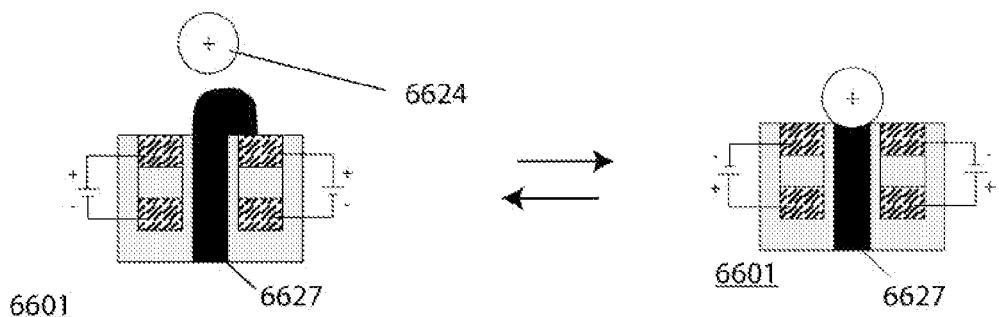

FIGS. 75 and 76 illustrate electrically controllable electrostatic beads 6620 in accordance with some embodiments. The system 6600 that is able to be used to control the electrostatic beads 6620 is able to be manufactured using the molding method described above. The electrostatic beads 6620 are able to respond to the change of polarity when the charges in the electro-conductive layers 6621 and 6623 are reversed. Layer 6622 is able to be made out of a non-conductive material. The electrostatic beads 6620 are able to move either up to the tip 6627 of the nozzle or down to the base 6628 of the nozzle depending on the polarity associated with the electrostatic beads 6620, electro-conductive layer 6621, and electro-conductive layer 6623.

FIG. 76 illustrates another method of electrically controlling electrostatic beads 6620 in accordance with some embodiments. The system 6601 that is able to be used to control the electrostatic beads 6624 is able to be manufactured using the molding method described above. In some embodiments, the size of the electrostatic beads is larger than the size of the pores, the beads 6624 are able to be activated by the electrodes (e.g. by electric attraction) to move to seal against the nozzles. When in the sealed state, the system 6601 is able to prevent material 6627 from moving out of the nozzle.

Figure 77:
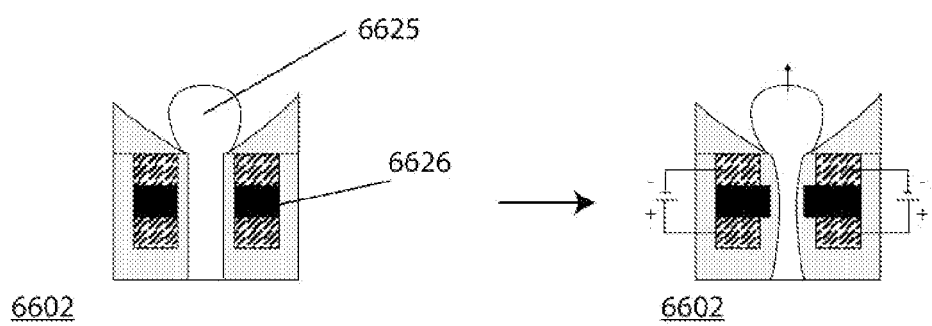

FIGS. 77 and 78 illustrate a controllable nozzle in accordance with some embodiments. In FIG. 77, the nozzle system 6602 is able to be manufactured using the molding method described above. In some embodiments, the layer 6626 is an electro-active material that is sandwiched between two electrically conductive layers. The charging of the electrodes are able to activate 6626 causing a change in the dimension of the nozzles. The change in the dimension (e.g. expanding horizontally) of the nozzles is able to create a pressure wave that forces fluid 6625 out of the nozzle.

FIG. 78 illustrates the application of structure 7100 in accordance with some embodiments. In some embodiments, the structure 7100 contains a nozzle 7101 with hollow cavities 7103. The hollow cavities 7103 are able to be created by molding using sacrificial layers. Cavities 7103 are able to be connected to a pressure source, such as a gas pump/gas tank. When the cavity 7103 expands, the side walls 7104 of the nozzle are able to contract, forcing the fluid 7102 out of the orifice.

FIG. 79 illustrates an application of pores and nozzles created within a membrane 7200 in accordance with some embodiments. In some embodiments, through pores 7201 are connected to a gas under pressure. The gas creates a bubble within each of the side wall structures 7202. Through pores 7203 are connected to the source fluid. The membrane 7200 is able to be immersed in a liquid medium. In operation, an energy source is able to be used to vibrate each of the bubbles. In some embodiments, the energy source is piezo discs, sound waves, diaphragms, or a combination thereof. As the bubble contracts and expands, a pressure wave created within the surrounding fluid is able to cause a fluidic motion. When particles 7204 are present within the fluidic medium, the particles are able to flow according to the pressure wave created by the bubbles. In some embodiments, the fluid 7205 injected through pores 7203 on the membrane 7206 is immiscible with the fluidic medium, such that droplets are able to be created from the through pores 7203.

FIG. 80 illustrates the creation of porous contact lenses 7300 in accordance with some embodiments. In some embodiments, a curved molding plate 7301 is used with the curvature designed according to the curvature of the molded lenses. The through pores 7305 within the molding plate 7301 allow flow 7302 to go through, causing the formation of pores 7304 within the molding material 7303. Using the manufacturing method, the resulting molded lens is able to have a desired curvature with a smooth outer surface 7306 and a smooth inner surface 7307 containing through pores 7304. The through pores 7304 on the contact lens 7300 are able to improve the tear exchange rate and the gas diffusion rate when compared with non-porous lenses.

Figure 81:
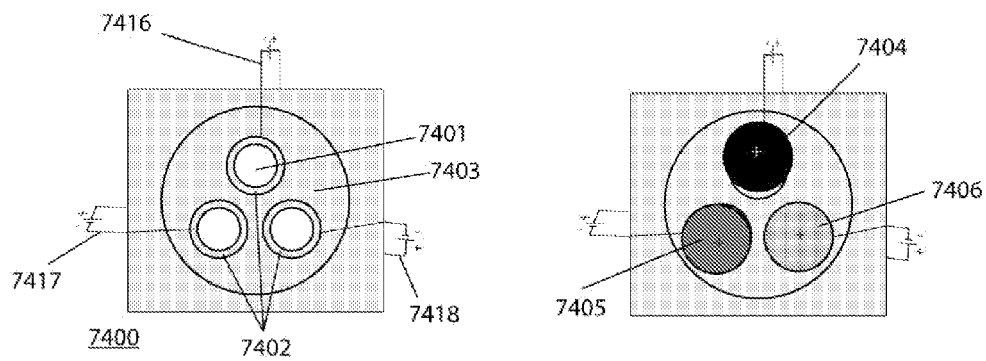
FIGS. 81-83 illustrate a color displaying device in accordance with some embodiments.
Figure 82:
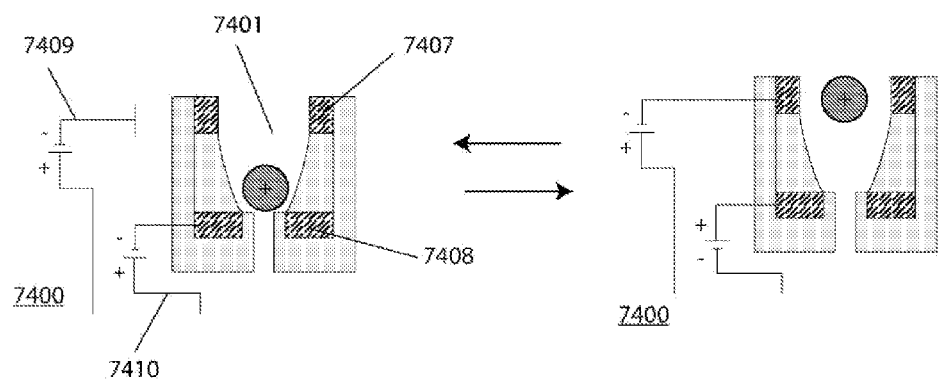
Figure 83:
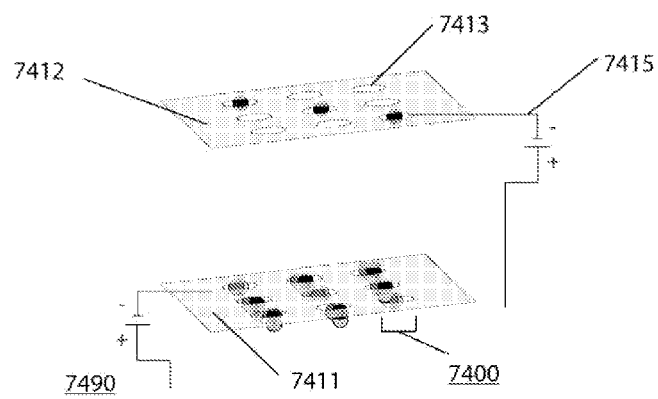

FIGS. 81-83 illustrate a color displaying device 7400 in accordance with some embodiments.

FIG. 81 illustrates the color displaying device 7400 in accordance with some embodiments. The color displaying device 7400 comprises electrically conductive nozzles 7402 with an inner through pore 7401 located in the middle of the nozzle 7402. The three nozzles 7402 are embedded inside another larger nozzle 7403. Each of the three nozzles shown is electrically separated from the other nozzles. Three different colored beads, 7404, 7405, 7406 are located on top of the nozzle pores.

FIG. 82 shows a cross-section front view of color displaying device 7400 of FIG. 81. Circuit 7409 charges electrode layer 7407, and circuit 7410 charges electrode layer 7408. Through controlling the polarity and the activation of electrode layers 7407 and 7408, the electrostatic beads are able to be shifted up or down within 7401.

FIG. 83 shows that the color displaying device 7400 of FIGS. 81 and 82 is able to be assembled into an array with a membrane component 7412 located above membrane 7411. The device 7490 is able to be used as a color display. The two membranes are separated by a distance required to produce a colored visual effect. The membrane component 7412 is able to be made of a conductive material. The membrane component 7412 is able to be connected to the circuit 7415. Through controlling the charges within the two membranes 7412 and 7411, the beads are able to be transported between the two membranes 7411 and 7412. Since the charges of each nozzle 7402 (FIG. 81) and the charges of each pore 7413 are controllable, each nozzle and pore unit are able to attract different electrostatic beads, and the collective results of the positioning of beads for each pore 7403 become a pixel that are able to be activated or de-activated. When the colored electrostatic beads are pulled into membrane 7412, the colors displayed within each nozzle 7413 become individual colored pixels. By transporting the color beads between membranes 7412 and 7411 different visual patterns are able to be displayed.

FIGS. 84 and 85 illustrate a method of creating an electromagnet material in accordance with some embodiments.

FIG. 84 shows a method of creating an electromagnet material 7500 in accordance with some embodiments. The electromagnet material 7500 is able to be created by filling channel 7501 of the membrane 7505 with a conductive material. Membrane 7505 is able to be made out of a non conductive material. Standout walls 7502 are part of the membrane 7505. Through pore 7503 is located within the middle of the electromagnet. Channel 7501 forms a winding pattern that simulates an electric coil. The channel 7501 begins at the rim of the circle and ends with an open end connected to pore 7503. In operation, one end of the battery is inserted into the pore 7503 to connect the end of channel 7501 while the other end of battery is connected to the inlet of channel 7501. When a current flows through the coil, an electromagnetic field is able to be created.

FIG. 85 shows another method of making electromagnet material 7600 in accordance with some embodiments. The electromagnet material 7600 is able to be created by stacked molding of different layers of conductive and insulative materials. The molding plate 7601 contains through pores 7602. The pores together form a spiral like pattern. During molding, the flow 7605 goes through the pores 7602 to create a spiral like pattern in the electrically conductive molding material 7603. Similarly, a spiral pattern is able to be formed in a non-conductive material 7604. The molded structure is able to be layered to have altering electrically conductive material 7603 and non conductive layers 7604. The magnetic strength increases as the number of alternating layers of conductive layers 7063 and non-conductive layers 7604 increases. In operation, one end of the battery is connected to the conduct paths inside the through pore 7606 and the other end of the battery is connected to the edge of each conductive layer.

Figure 86:
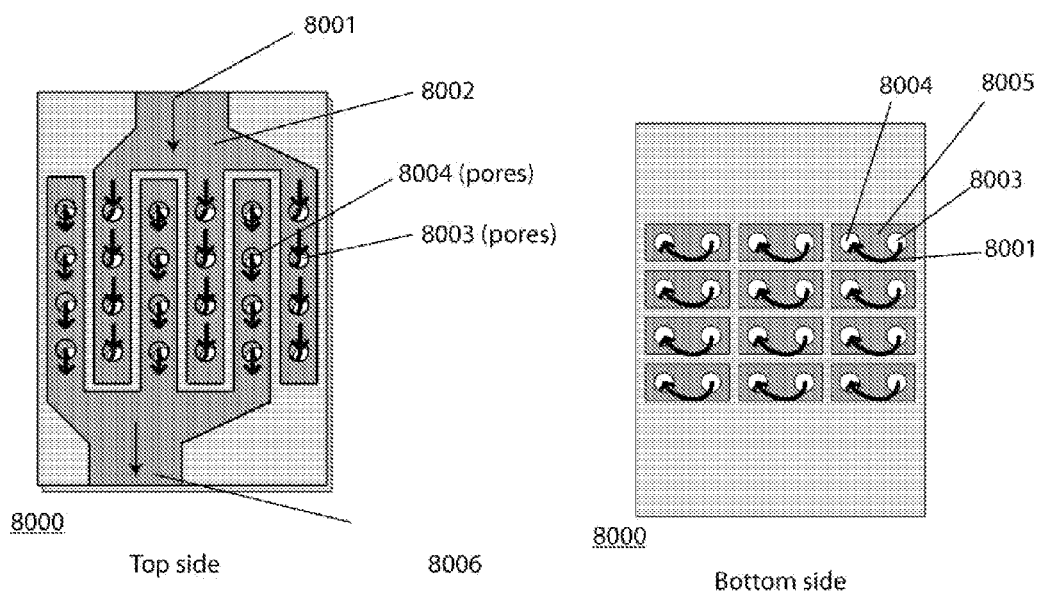
FIG. 86 illustrates a cooling system in accordance with some embodiments.

FIG. 86 illustrates a device 8000 for cooling microstructures in accordance with some embodiments. System 8000 is able to be made by the methods disclosed herein. The device is able to use a microflow to remove heat from a heating source. The flow used is able to be a liquid, a gas, or a stream of particles. The flow 8001 is able to first travel down channel 8002, travels vertically through pore 8003 to the bottom of the device, travels horizontally in cavity 8005, travels vertically upward through channel 8004, and then finally travels out of the device through channel 8006. In application, a source generating undesirable heat is attached to the bottom of the device, and as the flow is traveling vertically downward then upward through the channel and the pores, heat is absorbed by the flow. The cavity 8005 is able to be created by merging the two through pores 8002 and 8003 using the method presented previously in the current embodiment.

Figure 87:
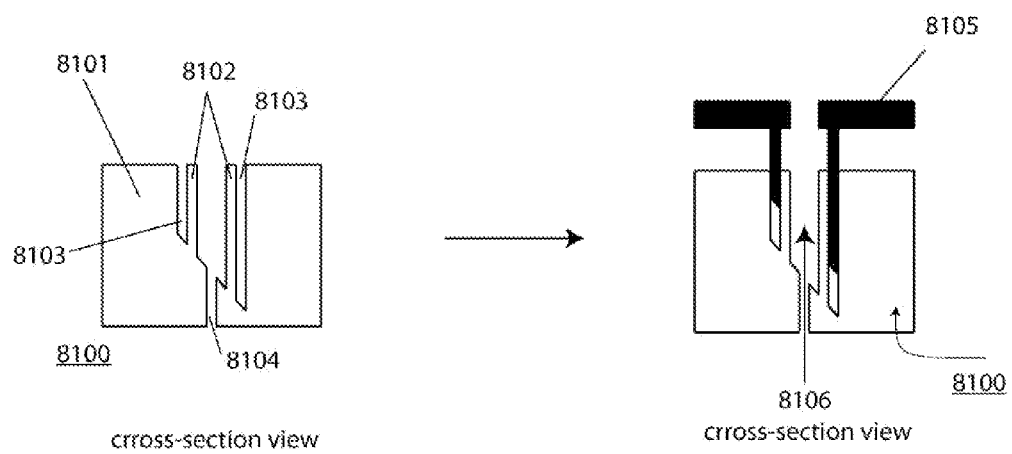
FIG. 87 illustrates a method for molding in accordance with some embodiments.

FIG. 87 shows the molding structure for creating hollow microneedles in accordance with some embodiments. The molding structure 8100 is able to contain the bulk material 8101. Within the bulk material, the molding structure contains cavity 8103, inner wall 8102, and a through pore 8104. Cavity 8103 is able to be a continuous cavity that surrounds the entire inner wall 8102. During molding, the molding material is able to be filled into structure 8100 while the flow 8106 runs through pore 8104. After molding is completed, the microneedle is able to be removed from the molding structure. The tip of the microneedle is able to have a tapered sharp end as the one shown in the figure. The size of each microneedle is able to have a diameter of less than 150 microns, a height of greater than 200 microns, and a central through pore of less than 50 microns. The needles are able to be manufactured as an array.

Figure 88:
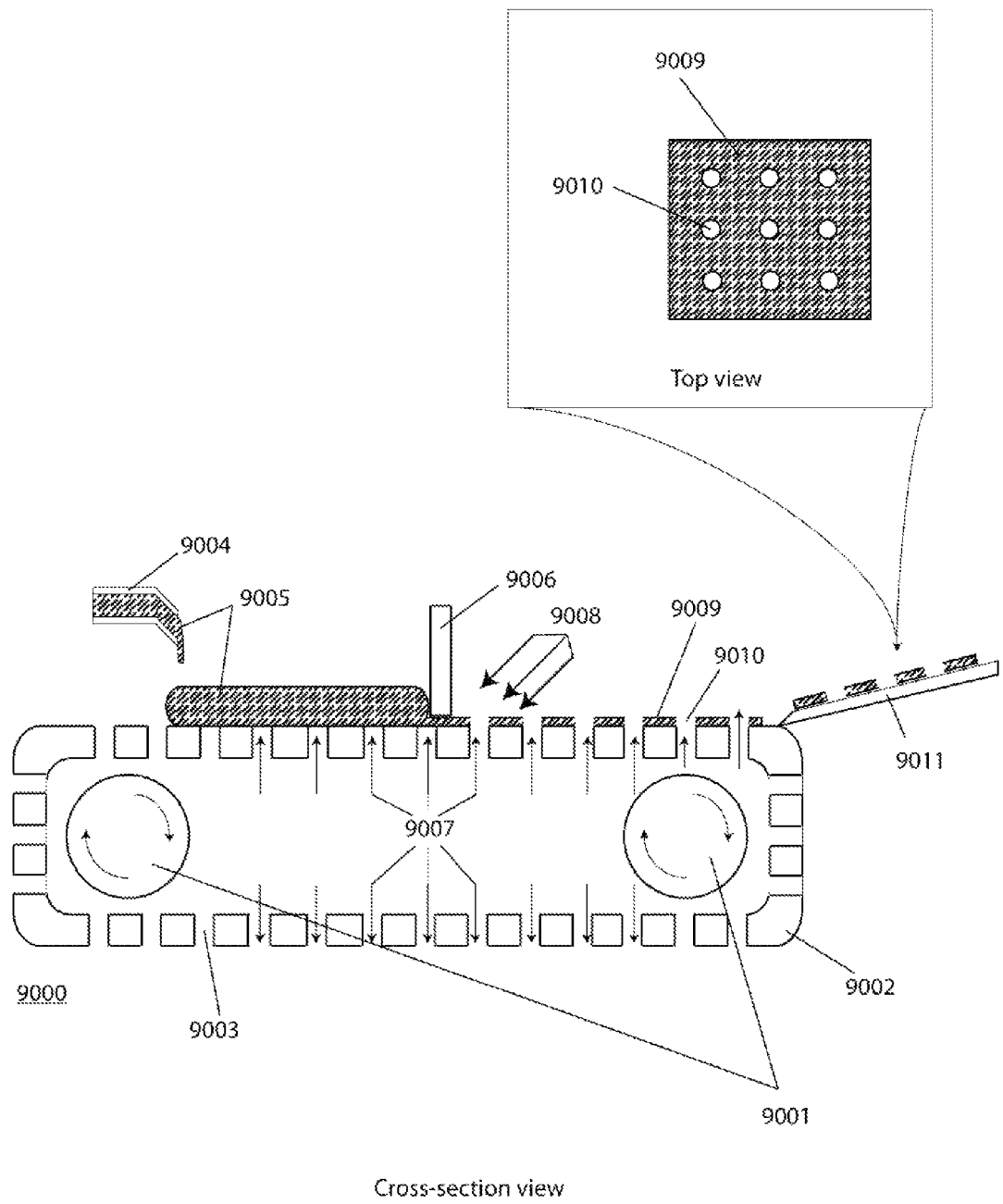
FIG. 88 illustrates a continuous microstructures generation system in accordance with some embodiments.

FIG. 88 illustrates a system 9000 that is able to continuously generate microstructures in accordance with some embodiments. System 9000 is able to comprise rollers 9001, molding plate 9002, pores within the molding plate 9003, a dispensing nozzle 9004, a molding material 9005, a height adjusting member 9006, a flow 9007, a solidifying factor 9008, and a separator 9011. The roller 9001 is able to roll the molding plate 9002 continuously. The dispensing nozzle 9004 is able to dispense the molding material 9005 onto the surface of the molding plate 9002. The height adjusting member 9006 is able to decrease the thickness of the molding material. Through the pores 9003 in the molding plate 9002, the flow 9007 is able to create pores 9010 in the molded materials 9009. The solidifying factor 9008 is able to solidify the molding material 9005. The solidifying factor is dependent on the molding material. The solidifying factor is able to be a heating source, a dispenser of chemicals, a UV source, a source of vapors, or a source of any other agents that are able to be used to solidify the molding material. The separator 9011 is able to separate the solidified structure from the molding plate. The components of system 9000 are able to be made from steel, aluminum, brass, metals, ceramic, plastics, and any other machinable compounds. The molding plate is able to be made out of a flexible material. The height adjusting member (separator) is able to be adjusted such that it limits the thickness of the molded material. For example, the thickness of the membrane can be limited to be less than 1 micron by adjust the separation distance to be less than 1 micron. The separation distance is the distance between the height adjusting member to the molding plate The methods and devices disclosed herein provide features and advantages over known methods and devices. For example: pores are formed within molded substrates through self-alignment; pores within different layers are able to be aligned when the flow passes through each layer; nanofluidic structures are able to be assembled by attaching two different molded layers together; multi-layered micro-discs and micro-cantilevers within each layer are able to be self-aligned according to the generated flow; and multi-layered high aspect ratio features are able to be formed by the methods disclosed herein.

Applications of the methods and devices described herein comprise microencapsulation, drug production, food encapsulation, emulsification production of micro and nanoparticles, liquid filtration (micro and nano filtration), gas filtration, needle for drug delivery, aerosol spray, membrane sensors (flow sensor, chemical sensor), biological tools (cell sorting, cell localization, culture, and analytical tools), ink jet printing, porous contact lenses, microvalves (flow regulation), and a combination thereof.

To utilize the methods of and devices for making microstructures, a user positions the molding plate inside the molding device, adjusts the molding condition, adds molding materials, adjusts conditions to solidify the molding materials, and remove the solidified materials.

In operation, one or more of pores on the molded material are able to be made. The nozzles, needles, and other structural features described in the current embodiment are able to be manufactured as a single unit or as an array of units. The sizes of the pores are able to be controlled by adjusting the flow conditions of a flow through fluid stream. A person of ordinary skill in the art will appreciate that any flow conditions are applicable, such as flowing speed, directions, and pattern. When making nozzles or any other structures, the thickness of the walls of the structures is able to be independent of the flow conditions and is able to be molded into any desired size/thickness using the geometry of the molding plate. A person of ordinary skill in the art will appreciate that the term flow stream comprises fluid stream (e.g. gas and liquid) and any other flowable streams (e.g. dispersion particles and electromagnetic fields).

The description is presented to enable one of ordinary skill in the art to make and use the invention. Various modifications to the described embodiments will be readily apparent to those persons skilled in the art and the generic principles herein may be applied to other embodiments. Thus, the present invention is not intended to be limited to the embodiments shown but is to be accorded the widest scope consistent with the principles and features described herein. It will be readily apparent to one skilled in the art that other modifications may be made to the embodiments without departing from the spirit and scope of the invention as defined by the appended claims.

What is claimed is:

1. A method of manufacturing a multi-layered membrane structure, comprising:
    providing a molding plate, wherein the molding plate includes a plurality of apertures, and the molding plate is coupled to a flow stream source;
    applying from the flow stream source a first flow stream to pass through the plurality of apertures of the molding plate;
    forming a first membrane layer of the membrane structure comprising a first set of pores using the first flow stream;
    controlling the first flow stream to generate a second flow stream which merges flows passing through a plurality of adjacent pores from the first set of pores of the first membrane layer; and
    forming a second membrane layer of the membrane structure comprising a second set of pores using the second flow stream.

2. The method of claim 1, wherein the forming the first membrane layer comprises:
    dispensing a first molding material to the molding plate while maintaining the first flow stream; and
    causing the first molding material to solidify for forming the first membrane layer.

3. The method of claim 2, wherein the forming the first membrane layer further comprises:
    forming one or more channels in the first membrane layer using the molding plate and the first flow stream; and
    filling the one or more channels in the first membrane layer with a sacrificial material.

4. The method of claim 1, wherein the controlling the first flow stream to generate the second flow stream comprises:
    adjusting the first flow stream to achieve a controlled flow level of the second flow stream.

5. The method of claim 4, wherein the adjusting the first flow stream comprises at least one of: adjusting the first flow stream based on a thickness of the second membrane layer; or adjusting the first flow stream based on a size of a second layer pore in the second set of pores.

6. The method of claim 1, wherein the forming the second membrane layer comprises:
    dispensing a second molding material to the first membrane layer while maintaining the second flow stream; and
    causing the second molding material to solidify for forming the second membrane layer.

7. The method of claim 6, wherein the forming the second membrane layer further comprises:
    prior to dispensing the second molding material to the first membrane layer, providing a sacrificial material to one or more channels in the first membrane layer; and
    removing the sacrificial material after the second membrane layer is formed.

8. The method of claim 6, wherein a second layer pore in the second set of pores is larger in area than a first layer pore in the first set of pores; and wherein the second layer pore in the second set of pores has a different shape than the first layer pore in the first set of pores.

9. The method of claim 1, further comprising:
    controlling the first flow stream to generate a third flow stream which merges flows passing through a plurality of adjacent pores from the second set of pores of the second membrane layer; and
    forming a third membrane layer of the membrane structure comprising a third set of pores using the third flow stream.

10. The method of claim 9, wherein the controlling the first flow stream to generate the third flow stream comprises:
    adjusting the first flow stream to achieve a controlled flow level of the third flow stream based on a thickness of the third membrane layer or based on a size of a third layer pore in the third set of pores.

11. The method of claim 9, wherein the forming the third membrane layer comprises:
    dispensing a third molding material to the second membrane layer while maintaining the third flow stream; and causing the third molding material to solidify for forming the third membrane layer.

12. The method of claim 9, wherein a third layer pore in the third set of pores is larger in area than a second layer pore in the second set of pores; and wherein the third layer pore in the third set of pores has a different shape than the second layer pore in the second set of pores.

\* \* \* \* \*